US011387328B2

(12) United States Patent
Ramaswamy et al.

(10) Patent No.: US 11,387,328 B2
(45) Date of Patent: Jul. 12, 2022

(54) III-N TUNNEL DEVICE ARCHITECTURES AND HIGH FREQUENCY MIXERS EMPLOYING A III-N TUNNEL DEVICE

(71) Applicant: Intel Corporation, Santa Clara, CA (US)

(72) Inventors: Rahul Ramaswamy, Portland, OR (US); Walid M. Hafez, Portland, OR (US); Marko Radosavljevic, Portland, OR (US); Sansaptak Dasgupta, Hillsboro, OR (US); Han Wui Then, Portland, OR (US); Nidhi Nidhi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 16/145,079

(22) Filed: Sep. 27, 2018

(65) Prior Publication Data
US 2020/0105881 A1    Apr. 2, 2020

(51) Int. Cl.
*H01L 29/88* (2006.01)
*H01L 29/778* (2006.01)
(Continued)

(52) U.S. Cl.
CPC ........ *H01L 29/2003* (2013.01); *H01L 27/088* (2013.01); *H01L 29/045* (2013.01);
(Continued)

(58) Field of Classification Search
CPC ........ H01L 29/66431; H01L 29/66462; H01L 29/778–7789; H01L 21/823412;
(Continued)

(56) References Cited

U.S. PATENT DOCUMENTS 5,561,305 A * 10/1996 Smith ................ G01R 31/2621
257/194
2014/0110759 A1* 4/2014 Murata ............... H01L 29/7783
257/194
(Continued)

OTHER PUBLICATIONS

Moon, J. et al. "Double Barrier Resonant Tunneling Transistor with a Fully Two Dimensional Emitter", https://www.osti.gov/servlets/purl/759887; Sandia National Laboratories, Albuquerque, New Mexico; Jul. 13, 2000, 23 pages.

*Primary Examiner* — Eric A. Ward
(74) *Attorney, Agent, or Firm* — Essential Patent Group, LLP

(57) ABSTRACT

Group-III nitride (III-N) tunnel devices with a device structure including multiple quantum wells. A bias voltage applied across first device terminals may align the band structure to permit carrier tunneling between a first carrier gas residing in a first of the wells to a second carrier gas residing in a second of the wells. A III-N tunnel device may be operable as a diode, or further include a gate electrode. The III-N tunnel device may display a non-linear current-voltage response with negative differential resistance, and be employed as a frequency mixer operable in the GHz and THz bands. In some examples, a GHz-THz input RF signal and local oscillator signal are coupled into a gate electrode of a III-N tunnel device biased within a non-linear regime to generate an output RF signal indicative of a frequency difference between the RF signal and a local oscillator signal.

20 Claims, 20 Drawing Sheets

(51) Int. Cl.
*H01L 29/20* (2006.01)
*H01L 29/205* (2006.01)
*H01L 29/04* (2006.01)
*H01L 27/088* (2006.01)
*H01L 29/78* (2006.01)

(52) U.S. Cl.
CPC .......... *H01L 29/205* (2013.01); *H01L 29/778* (2013.01); *H01L 29/88* (2013.01); *H01L 29/78* (2013.01)

(58) Field of Classification Search
CPC ......... H01L 21/823456; H01L 21/8252; H01L 27/0605; H01L 27/088; H01L 27/0883; H01L 29/0847; H01L 29/32; H01L 29/402; H01L 29/4236; H01L 29/7783; H01L 29/7786; H01L 29/882; H01L 29/045; H01L 29/2003; H01L 29/205; H01L 29/78; H01L 29/88; H03D 7/00
See application file for complete search history.

(56) References Cited

U.S. PATENT DOCUMENTS

2015/0221758 A1* 8/2015 Miura .................. H01L 29/205
257/76
2017/0229569 A1* 8/2017 Chowdhury ........ H01L 29/7787

* cited by examiner

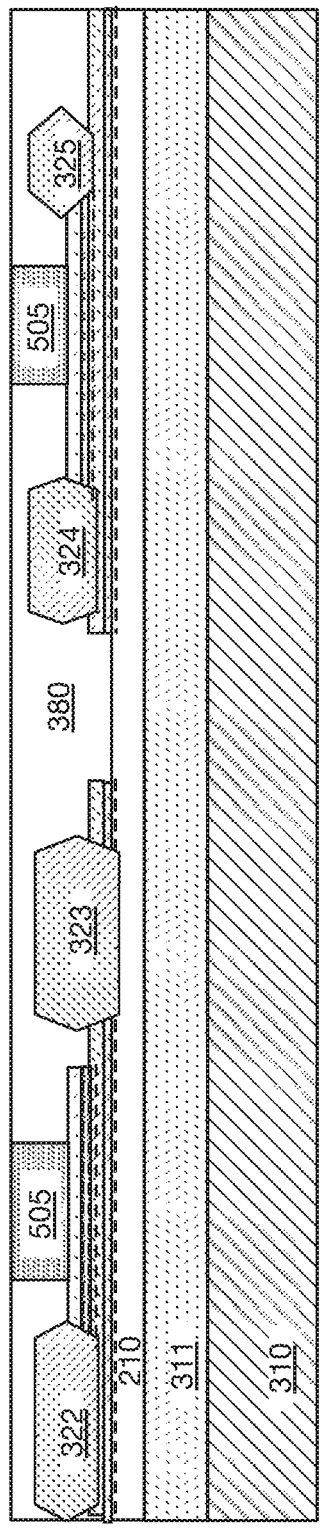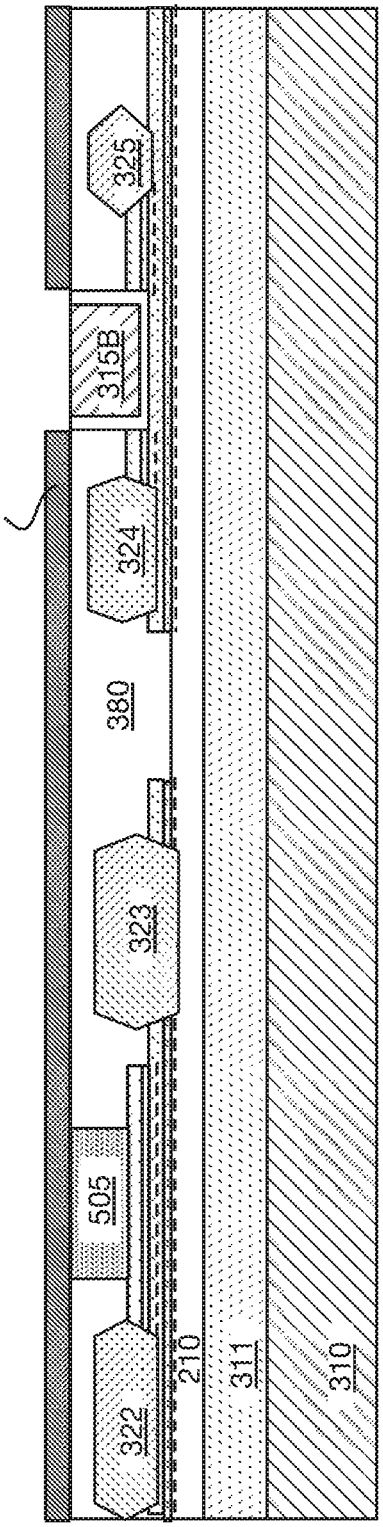

III-N TUNNEL DEVICE ARCHITECTURES AND HIGH FREQUENCY MIXERS EMPLOYING A III-N TUNNEL DEVICE

BACKGROUND

Demand for integrated circuits (ICs) in portable electronic applications has motivated higher levels of semiconductor device performance. Mobile handset applications, for example, include wireless (radio frequency, or RF) transmitters and receivers (transceivers) that may operate in the gigahertz (GHz) frequency band. At such frequencies, detecting and/or mixing of RF signals, for example to perform a heterodyning function can be challenging. As a result, GaAs devices may be employed within an RF front end (RFFE) architecture. However, such GaAs devices typically have narrow bandwidth (e.g., 1-5 GHz) and have relatively low power ratings associated with their bandgap and/or leakage level. Modern multi-band and wideband standards are also increasing the complexity of the RF front end (RFFE) to a point where GaAs devices will continue to be an architecture bottleneck.

Semiconductor device architectures and techniques that may overcome these limitations are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 5A, 5B, 5C, 5D, 5E, 5F, 5G, 5H, 5I, 5J, 5K, 5L, 5M, 5N, 5O, 5P, 5Q, and 5R are cross-sectional views of III-N planar channel FET and III-N tunnel device structures as selected operations of the methods illustrated in FIG. 4 are performed, in accordance with some embodiments;

DETAILED DESCRIPTION

Figure 1A:
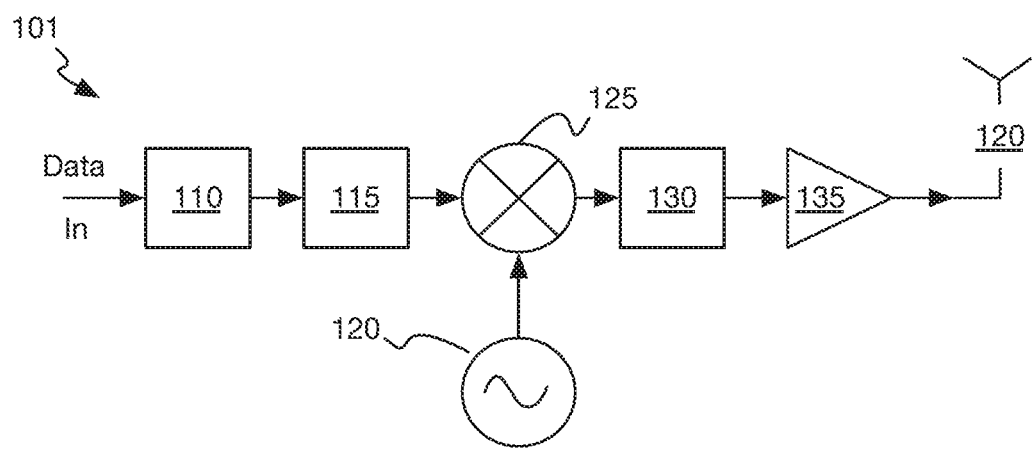
FIG. 1A illustrates a schematic of a RF circuit, in accordance with some embodiments.

Group III-nitride (III-N) tunnel device structures suitable for high frequency RF mixing are described herein. Exemplary methods of fabricating an IC including III-N tunnel device structures suitable for implementing GHz-THz band mixer are further described. In the following text, numerous specific details are set forth, such as illustrative device architectures, to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As further described below, III-N tunnel device structures include two or more quantum wells, each of the wells comprise a III-N material suitable for hosting a carrier gas and they are separated by a tunnel barrier that comprises one or more III-N material layers having a larger bandgap. The III-N tunnel device structures may sustain a voltage bias across the quantum wells such that carriers of one carrier gas may transit to the other carrier gas (e.g., tunnel through the tunnel barrier), and thereby couple a first terminal of the device structure with a second terminal of the device structure. The III-N tunnel device may display a highly nonlinear current-voltage (I-V) response, or transconductance.

III-N tunnel device structures in accordance with embodiments herein may comprise a III-N epitaxial structure including a back barrier suitable for defining multiple quantum wells. A bias voltage applied across first terminals of the device may align the band structure to permit carrier tunneling between a first carrier gas residing in a first of the wells to a second carrier gas residing in a second of the wells.

III-N tunnel device structures in accordance with embodiments herein may be implemented as a diode (e.g., a tunnel diode), or as a transistor (e.g., a tunnel transistor). For transistor embodiments, the gate may provide control over a carrier gas within one or more of the quantum wells through the field effect. A source in contact with a first carrier gas may be coupled through the tunnel barrier to a drain contact in contact with a second carrier gas. Gate control of well potential may therefore modulate a current of the device. A peak current within a nonlinear regime of the device may be controlled through the gate.

III-N tunnel devices in accordance with embodiments herein may be employed in a variety of circuits that may benefit from the very high operating speeds of the device structures and/or from their non-linear operation. In some exemplary embodiments, one or more circuits within radio transmitter and/or receiver circuitry employ one or more such III-N tunnel device structures.

FIG. 1A illustrates a schematic of RF uplink circuitry 101, in accordance with some embodiments. RF uplink circuitry 101 may be employed in a wireless device, such as a mobile handset, for example. RF uplink circuitry 101 includes a baseband portion including, for example, a modulator (baseband processor) 110, which may be implemented by a digital signal processor (DSP). Coupled to an output of the baseband stage is an RF front-end (RFFE) that comprises circuitry between an antenna 120 up to, and including, frequency mixer 125. The RFFE further includes power amplifier (PA) 135, which has an input coupled to antenna 120, and an output coupled to an input of a bandpass filter (BPF) 130. A transmitter (i.e., RF up converter) comprising a frequency mixer 125 has an input coupled to receive an RF input signal within an intermediate frequency band from an output of intermediate frequency (IF) filter 115. During operation, IF filter 115 may reject out-of-band (OOB) RF signals that may cause unwanted mixer responses. An input of frequency mixer 125 is further coupled to an output of a local oscillator (LO) 120. During operation, mixer 125 may receive a reference signal from LO 120.

Figure 1B:
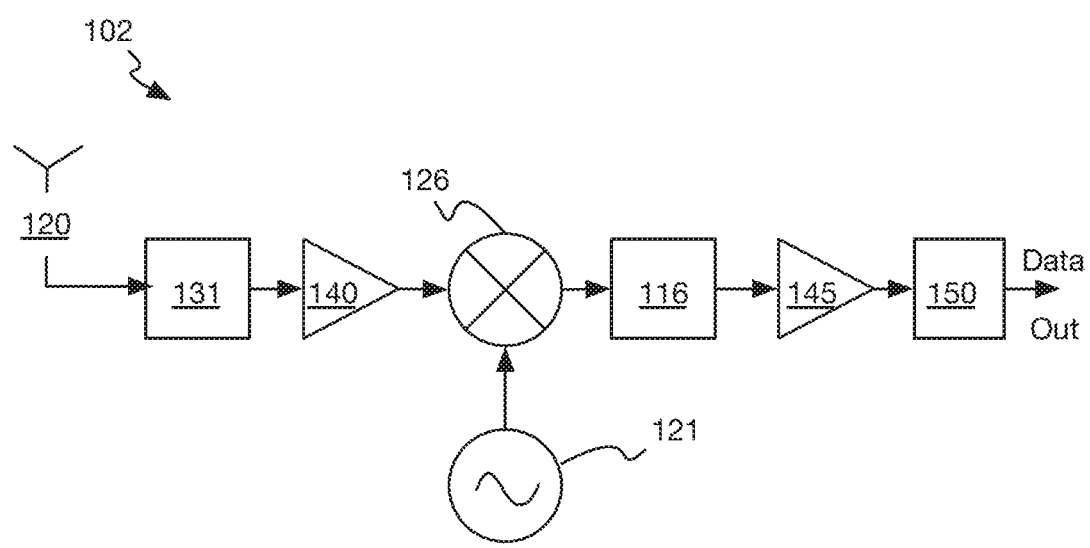
FIG. 1B illustrates a schematic of a RF circuit, in accordance with some embodiments.

FIG. 1B illustrates a schematic of an RF downlink circuitry 102, in accordance with some embodiments. RF downlink circuitry 102 may be employed in a wireless device, such as a mobile handset, for example. In some such embodiments, the mobile handset including uplink circuitry 101 (FIG. 1A) also includes downlink circuitry 102 (FIG. 1B). RF downlink circuitry 102 includes a demodulator (digital baseband processor) 150. The RF front-end (RFFE) comprises circuitry between antenna 120 up to, and including, frequency mixer 126. The RFFE further includes low noise amplifier (LNA) 140 coupled between antenna 120 and a BPF 131. A receiver (i.e., RF down converter) comprising frequency mixer 126 is coupled to receive an RF signal input from LNA 140, and is further coupled to receive a reference signal input from LO 121. An output of mixer 126 is coupled to intermediate frequency (IF) filter 116. During operation, mixer 126 may output an RF signal within an intermediate frequency band to IF filter 116. An output of IF filter 116 is coupled to an input of an IF amplifier 145, which during operation may amplify the IF signal upstream of demodulator 150.

In some embodiments, at least some circuitry within the RFFE of either (or both) RF circuitry 101 and 102 includes a III-N device structure. In one example, PA 135 (FIG. 1A) includes at least one planar III-N channel field effect transistor (FET) structure. In another example, LNA 140 (FIG. 1B) includes at least one planar channel III-N FET structure. In another example, frequency mixer 125 (FIG. 1A) includes at least one III-N tunnel device structure having one or more of the features described further herein. In another example, frequency mixer 126 (FIG. 1B) includes at least one III-N tunnel device structure having one or more of the features described further herein. In further examples, both the PA 135 and mixer 125 include planar III-N channel FET structures and III-N tunnel devices, respectively. In some such embodiments, the PA 135 and mixer 125 may be integrated into a single IC (e.g., an RFIC). In other examples, both the LNA 140 and mixer 126 include planar III-N channel FET structures and III-N tunnel device structures, respectively. In some such embodiments, the LAN 140 and mixer 126 may be integrated into a single IC (e.g., an RFIC). In some further embodiments, amplifiers 135 and 140 and mixers 125 and 126 all include III-N device structures that are integrated into a single RFIC.

In some embodiments, a frequency mixer operable in the GHz and/or THz band(s) comprises a III-N tunnel device structure. III-N semiconductors have the advantage of high carrier (e.g., electron) mobility and a wide band gap suitable for sustaining high breakdown voltages. The high carry mobility may enable tunnel device structures to operate throughout the GHz band (e.g., 1.6 GHz, 2-2.4 GHz, 3.5 GHz, 10 GHz, 100 GHz etc.), and well into THz frequencies. The high breakdown voltage may enable tunnel device structures to sustain high RF signal power without incurring excessively large IC footprints. Another advantage is that an RFFE (e.g., a power amplifier circuitry) may further employ planar III-N channel FETs, enabling the mixer circuitry to be integrated with other RFFE circuitry using the same device and fabrication technologies.

Figure 2A:
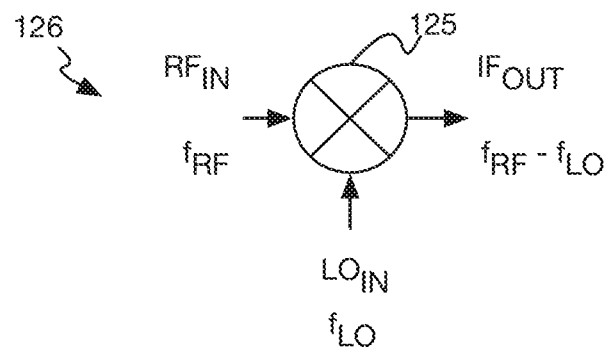
FIG. 2A illustrates a schematic of a frequency mixer, in accordance with some embodiments.

FIG. 2A illustrates a schematic of frequency mixer 126, in accordance with some embodiments. Mixer 126 is to transform a high RF signal into a lower intermediate frequency (IF). Mixer 126 may be used in a superheterodyne receiver circuitry of the type described above (FIG. 1B) to transform a high radio frequency ($f_{RF}$) to a lower intermediate frequency ($f_{IF}$). In some embodiments, $f_{RF}$ is in the GHz band (e.g., 1-3.6 GHz center frequency). In other embodiments, $RF_{IN}$ is in the THz band. Mixer 126 is to output $IF_{OUT}$ having an intermediate frequency, $f_{IF}$ that is the difference between the mixer's RF input $RF_{IN}$, and LO signal input $LO_{IN}$ having a controlled frequency $f_{LO}$. This downconversion process can be described by: $f_{IF}=f_{RF}-f_{LO}=-f_{RF}+f_{LO}$. In some embodiments, $f_{IF}$ is in the MHz band (e.g., 100-700 MHz). In other embodiments, $f_{IF}$ is in the GHz band. Mixer 125 (FIG. 1A) may be similarly employed in transmitter circuitry to transform an input intermediate frequency signal into a high radio frequency that is a sum between the mixer's LO signal (e.g., $f_{LO}$ in the 3-6 GHz range, 1-3 THz range, etc.) and the intermediate frequency signal (e.g., $f_{IF}$ in the 100-700 MHz range, 1-10 GHz range, etc.) to arrive at the high frequency RF signal (e.g., $f_{RF}$ in 1-3.6 GHz range, THz range, etc.).

Figure 2B:
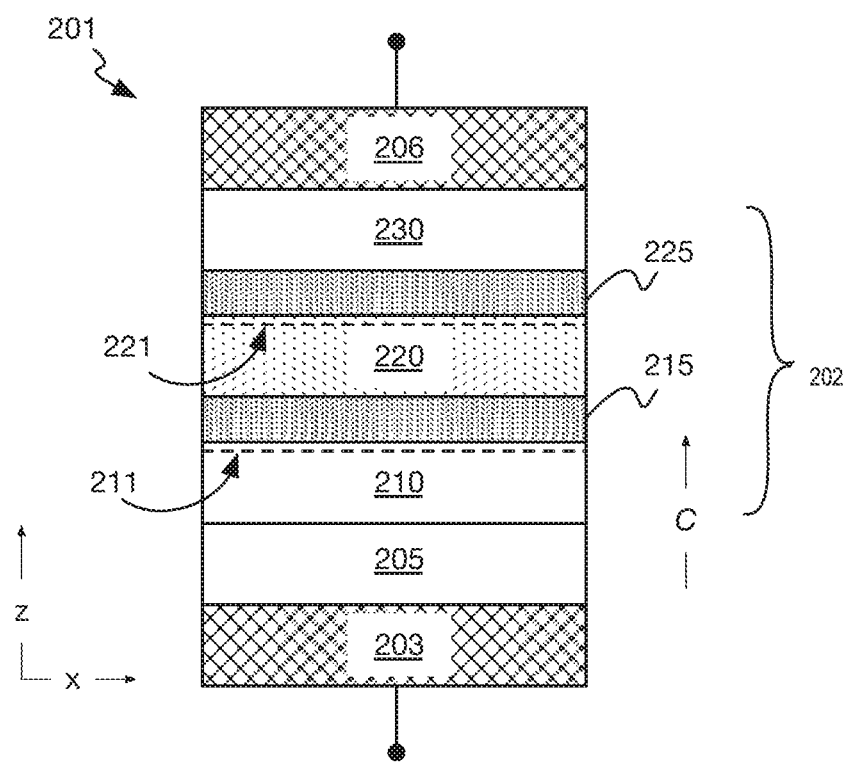
FIG. 2B is a cross-sectional profile view of a two terminal tunnel device structure including a III-N heterostructure, in accordance with some embodiments.

FIG. 2B is a cross-sectional profile view of a two terminal III-N tunnel device 201 that further includes a III-N heterostructure, in accordance with some embodiments. III-N tunnel device structure 201 is generally a tunnel diode that employs a III-N heterostructure having at least one back barrier. The III-N materials comprising III-N heterostructure 202 may each have substantially monocrystalline microstructure (e.g., hexagonal Wurtzite). Although monocrystalline, it is noted that crystal quality of III-N crystalline materials may vary dramatically, for example as a function of the techniques employed to form III-N heterostructure 202, and the substrate upon which they are formed. In some exemplary embodiments, dislocation density within III-N heterostructure 202 is in the range of $10^6$-$10^{11}$/cm$^2$. FIG. 2B illustrates crystal orientations of III-N heterostructure 202, in accordance with some embodiments where the thickness of the materials along a c-axis of the crystal is approximately on the longitudinal device axis (e.g., z-axis). In this orientation, the crystal structure of III-N heterostructure 202 lacks inversion symmetry with the (0001) and (000-1) planes not being equivalent. In illustrated embodiments, III-N heterostructure 202 may be characterized as having +c polarity with the c-axis extending in the <0001> direction.

As shown in FIG. 2B, between terminal metallization 203 and 206, III-N heterostructure 202 includes a quantum well layer 210 and another quantum well layer 220. Between well layer 210 and terminal metallization 203 there may be one or more semiconductor contact layers 205 interfacing III-N well layer 210 to terminal metallization 203. Between well layer 220 and terminal metallization 206 there may likewise be one or more semiconductor contact layers (not depicted) interfacing III-N well layer 220 to terminal 206. Well layer 210 forms a heterojunction with a polarization layer 215. Well layer 220 forms a heterojunction with polarization layer 215, and another heterojunction with another polarization layer 225. Polarization layer 225 may be considered a back barrier of well layer 220, and as further described below, polarization layer 225 forms at least a portion of a tunnel barrier between well layers 210 and 220.

Each of the materials within III-N heterostructure 202 comprises nitrogen as a first majority lattice constituent, and has a second majority lattice constituent including one or more elements from Group III of the Periodic table. Well layer 210 may be any III-N material known to be suitable for sustaining a carrier gas, such as the illustrated two-dimensional electron gas (2 DEG) 211. Polarization layer 215 may be any III-N material known to be suitable for inducing the carrier gas within well layer 210. Well layer 220 may be any III-N material known to be suitable for sustaining a carrier gas (e.g., 2 DEG 221), while polarization layer 225 may be any III-N material known to be suitable for inducing the carrier gas within well layer 220.

In some embodiments, well layer 210 is a binary alloy (e.g., GaN, AlN, InN). In some such embodiments, which have an advantageously high carrier mobility, well layer 210 is binary GaN. In other embodiments, well layer 210 is a ternary alloy (e.g., $Al_xIn_{1-x}N$, $In_xGa_{1-x}N$, or $Al_xGa_{1-x}N$). In still other embodiments, well layer 210 is a quaternary alloy (e.g., $In_xGa_yAl_{1-x-y}N$). Well layer 210 may have any impurity dopants. However, in some advantageous embodiments, well layer 210 is intrinsic and not intentionally doped with impurities associated with a particular conductivity type. For example, intrinsic impurity (e.g., Si) level in well layer 210 may be advantageously less than 1e17 atoms/cm$^3$, and in some embodiments is between 1e14 and 1e16 atoms/cm$^3$.

Polarization layer 215 may comprise any alloy distinct from that of well layer 210 that is further suitable for modulating the polarization field strength (e.g., spontaneous and/or piezoelectric) between these two III-N materials. Where spontaneous and/or piezoelectric polarization field strengths are sufficiently different between well layer 210 and polarization layer 215, a charge carrier gas (e.g., 2 DEG 211) is formed within well layer 210 in the absence of any externally applied field. Hence, polarization layer 215 may also be referred to in functional terms as a "polarization inducing layer" as it induces a polarization charge in heterostructure 202. In some embodiments, III-N polarization layer 215 comprises a binary alloy (e.g., GaN, AlN, InN). In some other embodiments, polarization layer 215 comprises a ternary alloy (e.g., $Al_xIn_{1-x}N$, $In_xGa_{1-x}N$, or $Al_xGa_{1-x}N$). In still other embodiments, polarization layer comprises a quaternary alloy (e.g., $In_xGa_yAl_{1-x-y}N$). In some embodiments, polarization layer 215 has a greater amount of Al than does well layer 210. In some such embodiments, at least a partial c-axis thickness of polarization layer 215 is binary AlN. In further embodiments, polarization layer 215 may comprise multiple materials, each of which may have a distinct III-N alloy composition (e.g., AlN, and $In_xGa_yAl_{1-x-y}N$, etc.).

In some embodiments, well layer 220 is a binary alloy (e.g., GaN, AlN, InN). In some such embodiments, which have an advantageously high carrier mobility, well layer 220 is binary GaN. In other embodiments, well layer 220 is a ternary alloy (e.g., $Al_xIn_{1-x}N$, $In_xGa_{1-x}N$, or $Al_xGa_{1-x}N$). In still other embodiments, well layer 220 is a quaternary alloy (e.g., $In_xGa_yAl_{1-x-y}N$). Well layer 220 may have any impurity dopants. However, in some advantageous embodiments, well layer 220 is intrinsic and not intentionally doped with impurities associated with a particular conductivity type. For example, intrinsic impurity (e.g., Si) level in well layer 220 may be advantageously less than 1e17 atoms/cm$^3$, and in some embodiments is between 1e14 and 1e16 atoms/cm$^3$.

Polarization layer 225 may comprise any alloy distinct from that of well layer 220 that is further suitable for modulating the polarization field strength (e.g., spontaneous and/or piezoelectric) between these two III-N materials. Where spontaneous and/or piezoelectric polarization field strengths are sufficiently different between well layer 220 and polarization layer 225, a charge carrier gas (e.g., 2 DEG 211) is formed within well layer 220 in the absence of any externally applied field. Hence, polarization layer 225 also induces a polarization charge in heterostructure 202. In some embodiments, III-N polarization layer 225 comprises a binary alloy (e.g., GaN, AlN, InN). In some other embodiments, polarization layer 225 comprises a ternary alloy (e.g., $Al_xIn_{1-x}N$, $In_xGa_{1-x}N$, or $Al_xGa_{1-x}N$). In still other embodiments, polarization layer comprises a quaternary alloy (e.g., $In_xGa_yAl_{1-x-y}N$). In some embodiments, polarization layer 225 has a greater amount of Al than does well layer 220. In some such embodiments, at least a partial c-axis thickness of polarization layer 225 is binary AlN. In further embodiments, polarization layer 225 may comprise multiple materials, each of which may have a distinct III-N alloy composition (e.g., AlN, and $In_xGa_yAl_{1-x-y}N$, etc.).

Figure 2C:
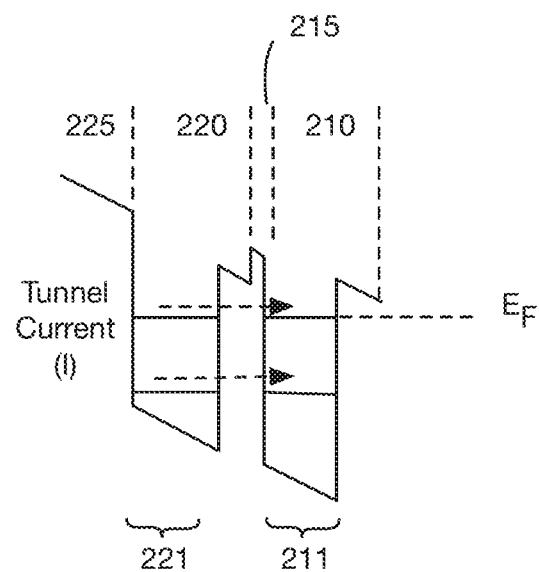
FIG. 2C is a band diagram illustrating a portion of the III-N heterostructure illustrated in FIG. 2B, in accordance with some embodiments.

FIG. 2C is a band diagram illustrating a portion of III-N heterostructure 202 under a voltage bias applied between terminal 203 and 206, in accordance with some embodiments. Under the illustrated bias, terminal 206 may be functional as an emitter terminal, while terminal 203 may be functional as a collector terminal. Polarization layer 225 has a wider bandgap (e.g., with conduction band offset) than well layer 220. Polarization layer 215 likewise has a wider bandgap than well layer 220. In the illustrated example, polarization layer 215 also has a wider bandgap than well layer 210. In exemplary embodiments, polarization layer 215 has a sufficiently small c-axis thickness to be operable as a tunnel barrier, which charge carriers (e.g., from 2 DEG 221) may pass through when an electric field is present within the heterostructure 202 (e.g., from a voltage bias across terminals 203 and 206) that aligns the sub-bands of quantum well layers 220 and 210 in the manner shown by the horizontal lines in FIG. 2C where the dashed arrows represent electrons tunneling from 2 DEG 221, through polarization layer 215, and into well layer 210 where 2 DEG 211 resides.

In accordance with some exemplary embodiments, polarization layer 215 has a c-axis thickness that is no more than 2 nm, and advantageously approximately 1 nm. The barrier between 2 DEG 221 and 2 DEG 211 may further comprise a partial thickness of well layer 220 where 2 DEG 221 is not induced. As such, the total thickness of well layer 220 may be limited to facilitate carrier tunneling. In accordance with some exemplary embodiments, well layer 220 has a thickness less than 7 nm, and advantageously no more than 5 nm, with the lower thickness limit being where the 2 DEG 221 becomes adversely affected by the proximity of polarization layer 215. Well layer 220 can therefore be expected to have a thickness greater than polarization layer 215 (i.e., greater than 2 nm). The c-axis thickness of well layer 210 may vary more liberally, for example from 10 nm to 1 μm, or more. Thickness of polarization layer 225 may also vary more liberally, but in some examples has approximately the same thickness as polarization layer 215. Additional polarization material layers of different compositions may also be present, as exemplified by polarization layer 230, which may comprise $Al_xGa_{1-x}N$, for example, and have any suitable thickness (e.g., 10-50 nm).

Although the band structure illustrated in FIG. 2C may be achieved with a variety of III-N alloy combinations, in accordance with some embodiments at least one of well layers 210 and 220 is predominantly binary GaN. In one such embodiment, where well layer 220 is binary GaN, well layer 210 is a ternary GaN alloy further including 2-7 atomic % Al (e.g., $Al_xGa_{1-x}N$ where x is approximately 0.05). For such embodiments, and as noted above, polarization layers 215 and 225 may include more Al than well layers 210 and 220, respectively, with each of them being binary AlN in one example.

Figure 2D:
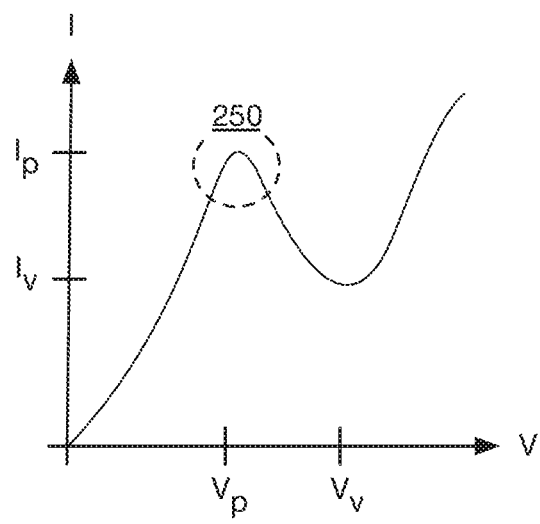
FIG. 2D is a graph illustrating non-linear transconductance of the tunnel device structure illustrated in FIG. 2B, in accordance with some embodiments.

In some embodiments, transconductance of III-N tunnel device structure 201 has significant non-linearity, for example of the type illustrated by the current-voltage (I-V) curve in FIG. 2D. As shown, III-N tunnel device structure 201 may have a non-linear response with a strong non-linear regime 250 around peak voltage $V_P$ where device current reaches a peak Ip, differential resistance then becomes negative (NDR) and current declines with further increases in voltage until reaching a valley at $V_v$. During operation, when a voltage is placed across tunnel device structure 201, a high frequency wave related to the energy value inside well layer 220 is emitted. As voltage is increased, the wave will extinguish where the energy value in the quantum well is outside that of well layer 220. Tunnel device structure structure 201, when biased within non-linear regime 250 is therefore well suited to the application of a frequency mixer, and hence, mixer 125 and/or mixer 126 may advantageously include a tunnel device structure structure 201 displaying non-linear transconductance, or negative differential resistance.

Figure 3A:
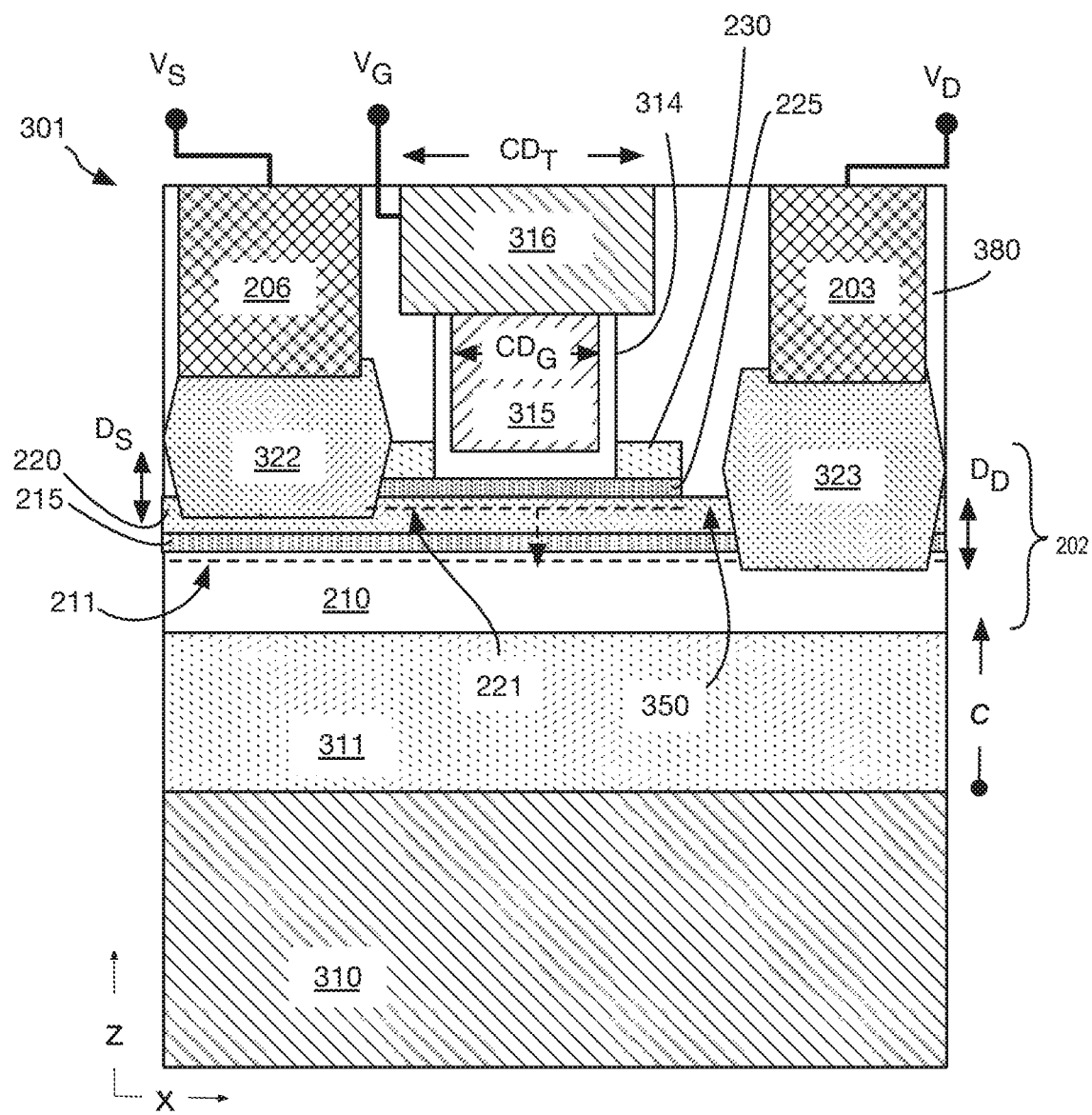
FIG. 3A is a cross-sectional profile view of a three terminal tunnel device structure including a III-N heterostructure, in accordance with some embodiments.

In some embodiments, a III-N tunnel device structure comprises three terminals. A three terminal tunnel device structure may include a III-N heterostructure having one or more of the features described above for III-N heterostructure 202. FIG. 3A is a cross-sectional profile view of a three terminal tunnel device structure 301 that includes III-N heterostructure 202, in accordance with some exemplary embodiments. Tunnel device structure 301 is tunnel transistor comprising a gate electrode 315, a source 322, and a drain 323. Tunnel device structure 301 has a substantially planar architecture with source 322 and drain 323 separated laterally (e.g. in x-dimension). Gate electrode 315 is located within a space between source 322 and drain 323. During operation, tunnel current (denoted by a dashed arrow in FIG. 3A) is between 2 DEG 221 and 2 DEG 211 through a c-axis thickness of the tunnel barrier. Gate electrode 315 is capacitively coupled to well layer 220 so as to modulate 2 DEG 221 within an emitter area associated with the lateral dimensions of gate electrode 315. Source 322 and drain 323 access the 2 DEG 221, and 2 DEG 211, respectively. The 2 DEGs 221 and 211 electrically couple source 322 to drain 323 through the tunnel barrier, as biased by source 322 and drain 323. Source 322 and drain 323 may therefore be operable as a 2D emitter and a 2D collector, respectively.

Tunnel device structure 301 has a metal-insulator-semiconductor (MIS) architecture that includes a gate dielectric 314 between gate electrode 315 and polarization layer 225. In alternative embodiments, a three terminal tunnel device structure may comprise a metal-semiconductor (MES), or junction FET (JFET) architecture. However, because a MESFET/JFET device architecture can suffer high gate leakage current at low forward bias voltages where the metal-semiconductor (Schottky) junction turns "on," the illustrated MIS architecture may be advantageous.

Figure 3B:
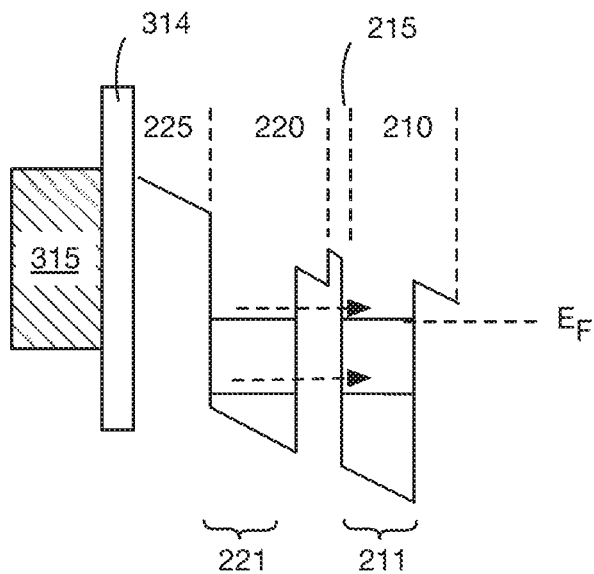
FIG. 3B is a band diagram illustrating a portion of the tunnel device structure illustrated in FIG. 3A, in accordance with some embodiments.
Figure 3C:
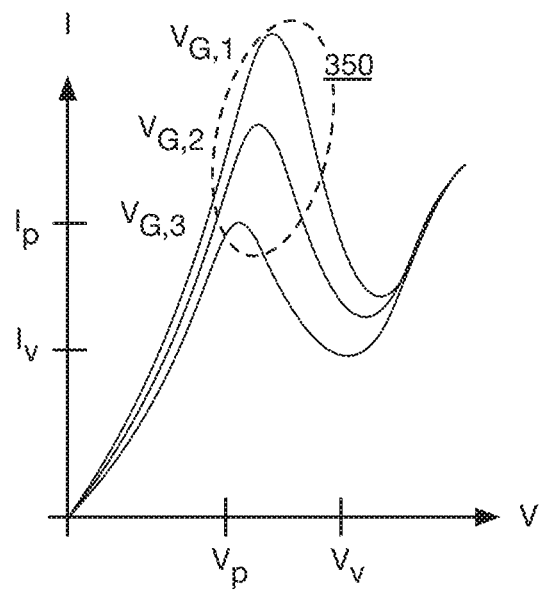
FIG. 3C is a graph illustrating gate control of non-linear transconductance of the tunnel device structure illustrated in FIG. 3A, in accordance with some embodiments.

FIG. 3B is a band diagram illustrating a portion of III-N heterostructure 202 as employed within tunnel device structure 301, in accordance with some embodiments. The band diagram has the same features described above in the context of tunnel device structure 201, with the addition of a gate stack gate including electrode 315 and gate dielectric 314. FIG. 3C is a current-voltage (I-V) graph illustrating gate control of non-linear transconductance of tunnel device structure 301 as a function of gate bias, in accordance with some embodiments. Each of the I-V plots display a non-linear regime 350 with the associated Ip/Vp operating point shifting with modulation of gate voltage between three arbitrary bias points $V_{G,1}$, $V_{G,2}$, and $V_{G,3}$. Gate electrode 315 may therefore have precise control of the peak current/voltage of the quantum well sub-band energy. As such, tunnel device structure 301 is well suited to the application of a high frequency mixer where both RF and LO input signals may be applied to gate electrode 315 to induce a frequency transformed output signal at drain 323.

In further reference to FIG. 3A, tunnel device structure 301 may be a portion of an IC that is affixed to any substrate 310. Substrate 310 may be a growth substrate comprising any material known to be suitable for III-N epitaxy. In some such embodiments, substrate 310 is crystalline SiC. In other such embodiments, substrate 310 is a cubic semiconductor, such as monocrystalline silicon. For such embodiments, tunnel device structure 301 may be formed over a cubic substrate surface, such as a (100) surface. However, III-N crystals having the illustrated c-axis orientation may also be grown on other surfaces (e.g., 110, 111, miscut or offcut, for example 2-10° toward [110] etc.), and so the c-axis of tunnel device structure 301 may be orthogonal to any of these substrate surfaces, as well. Tunnel device structure 301 may also be over a host substrate material to which III-N heterostructure 202 has been bonded. For such embodiments, the host substrate may be crystalline, or not (e.g., glass, polymer, etc.). Between substrate 310 and III-N heterostructure 202 may be any suitable buffer 311.

The source and drain each to couple the pair of carrier gas sheets, and during operation and source drain voltage (VDs) may place an electric field across the III-N heterostructure, for example to place tunnel device structure 301 at a non-linear operating point. In the example illustrated source 322 is coupled to 2 DEG 221, while drain 323 is coupled to 2 DEG 211. As shown, source 322 extends a depth $D_S$ through polarization layer 225 (as well as polarization layer 230), and lands on, or is embedded within, well layer 220 with access (e.g., direct contact) with 2 DEG 221. Drain 323 extends a greater depth $D_D$ through a c-axis thickness of polarization layer 225 (as well as polarization layer 230), and through the c-axis thickness of well layer 220 and polarization layer 215. Drain 323 lands on, or is embedded within, well layer 210 to have access (e.g., direct contact) with 2 DEG 211. Source 322 is separated from 2 DEG 211 by at least polarization layer 215, and therefore does not have direct access to charge carriers of 2 DEG 211. Drain 323 may be similarly electrically insulated from 2 DEG 221. In the example illustrated, a recess region 350 is proximal to drain 323. Within recess region 350 polarization layer 225 is absent, or otherwise of insufficient thickness to induce 2 DEG 221. Drain 323 therefore does not have direct access to charge carriers of 2 DEG 221.

As an alternative to recess region 350, a III-N tunnel device structure may include a depletion gate or other field plate structure. For such alternative embodiments, a field plate (not depicted) may be located between gate electrode 315 and drain 323, for example. During device operation, the field plate may be biased (e.g., independently of other device terminals) to some voltage sufficient to locally deplete carriers of 2 DEG 221 for the purpose of electrically insulating/isolating drain 323 from 2 DEG 221. A similar structure may be likewise employed to electrically insulate/isolate source 322 from 2 DEG 211 even where source 322 extends through polarization layer 215. For example, a backside field plate may be located under polarization layer 215 between source 322 and drain 323 to locally deplete 2 DEG 211 near source 322.

In the illustrated example, source and drain 322, 323 are each in physical contact with a c-plane (e.g., Ga-face) of III-N material. Source and drain 322, 323 therefore each have access to charge carriers within some nanometers of the quantum well heterojunctions. The junctions between well layers 210, 220 and source and drain 322, 323 may be homojunctions or heterojunctions. In some embodiments, source and drain 322, 323 are also III-N material(s). For example, source and drain 322, 323 may be InGaN. Some advantageous InGaN embodiments include 5-20% In ($In_x Ga_{1-x}N$ with 5%≤x≤20%). Source and drain 322, 323 may have an alloy composition that is constant or graded over their thickness between well layers and terminal metallization 203, 206. For some embodiments, source and drain 322, 323 are epitaxial, having the same crystallinity and orientation as III-N material 305. Exemplary hexagonal crystal facets are illustrated in FIG. 3A. For some other embodiments, semiconductor terminals 321-324 are polycrystalline, in which case crystal facets may not be as readily apparent.

Source and drain 322, 323 may be impurity doped to a desired conductivity type (e.g., with Si for n-type). The doping level of source and drain 322, 323 is advantageously as high as practical for lowest terminal/access resistance. The doping level may be at least an order of magnitude higher than that of well layers 210, 220, for example. In some exemplary embodiments where semiconductor source and drain 322, 323 are III-N alloys, the impurity dopant level is over $1e19$ atoms/cm$^3$, and more advantageously over $1e20$ atoms/cm$^3$. Si is one exemplary dopant atom for which such high (N+) doping levels may be achieved in III-N alloys. An alternative N-type dopant is Ge.

Tunnel device structure 301 includes a gate stack comprising gate electrode 315, and a gate dielectric 314. Gate electrode 315 is located within a recess in the underlying III-N material that extends a depth (e.g., z-dimension) through a c-axis thickness of polarization layer 230. While gate electrode 315 may be recessed completely through polarization layer 230, and even also through polarization layer 215, in some advantageous embodiments polarization layer 215 has a non-zero c-axis thickness below gate dielectric 314. The gate recess depth into III-N material may be predetermined to set a threshold voltage ($V_{GS}$) associated with tunnel device structure 301. In the illustrated example, 2 DEG 221 is present immediately below the gate stack under zero volts $V_{GS}$. Tunnel device structure 301 may therefore be considered a depletion mode device. If gate electrode 315 is sufficiently recessed, polarization layer thickness may become insufficient to sustain 2 DEG 221 immediately below the gate stack at zero volts $V_{GS}$. For such an embodiment, tunnel device structure 301 would be operable for an enhancement mode modulation of 2 DEG 221.

Gate dielectric 314 may have any composition suitable for the purpose, such as, but not limited to, silicon dioxide, silicon nitride, silicon oxynitride, and materials having a higher relative permittivity than silicon nitride (i.e., "high-k"

dielectrics). Some examples of high-k dielectrics include metal oxides (i.e., comprising a metal and oxygen), such as, but not limited to aluminum oxides, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate. Gate dielectric 314 may have any suitable thickness. In some embodiments, gate dielectric 314 has a thickness in the range of 3-50 nm.

Gate electrode 315 may have any composition suitable for the purpose. In some embodiments, where well layer 220 is binary GaN, an exemplary gate electrode may include at least one of Ni, W, Pt, or TiN. Each of these metals or metallic compounds may be associated with a particular work function (or metal-semiconductor work function difference) that may have some impact on threshold voltage.

As further illustrated in FIG. 3A, one or more dielectric materials 380 may provide electrical isolation between other elements of tunnel device structure 301, and/or provide surface passivation of III-N material not covered by a gate stack or semiconductor terminal. For example, dielectric material(s) 380 may have any composition known in the art to reduce dangling bonds and/or other surface defect states in III-N materials that may result in high transistor leakage currents. In some examples, dielectric material(s) 380 includes silicon and oxygen (e.g., silicon oxides or silicon oxynitrides). In some examples, dielectric material(s) 380 includes silicon and nitrogen (e.g., silicon oxynitrides or silicon nitride). In other embodiments, dielectric material(s) 380 includes a metal and oxygen (e.g., aluminum oxide, hafnium oxide, or titanium oxide). Dielectric material(s) 380 may have any microstructure (e.g., amorphous, polycrystalline or monocrystalline). Dielectric material(s) 380 may comprise separate material layers and/or structural features (e.g., sidewall spacers, liners, etc.).

In accordance with some further embodiments, device-level structural differences within a plurality of tunnel device structures may be employed to vary coupling efficiency of the tunnel device structures across any desired frequency band. For example, composition or dimensions of at least a portion of a gate terminal may be varied over a plurality of tunnel device structures present within an array of such device structures included in an IC. Individual ones of the tunnel device array, or separate sets of the tunnel devices may then include antenna elements that are tuned to couple most efficiently with a predetermined band of frequencies. Wideband RF mixing and/or RF detection circuitry may include such III-N tunnel device arrays.

Referring still to FIG. 3A, in tunnel device structure 301 includes a gate cap 316 having a minimum lateral dimension $CD_T$ that is larger than a minimum lateral dimension $CD_G$ of gate electrode 315. Gate electrode 315, as a pedestal, may have a nanometer CDG (e.g., 10-900 nm) suitable for achieving desired parametric device performance (e.g., 10 THz $f_T/f_{max}$). Gate cap 316 may have micron $CD_T$ with the resulting T-shape of the gate terminal than of a lateral dimension that is suitable as an RF radiation antenna element (e.g., for mm and sub-mm wavelengths), which is tunable without directly impacting parametrics of tunnel device structure 301. Gate cap $CD_T$ may therefore be modulated over a plurality of tunnel device structures as a means of tuning various ones of the tunnel devices to couple particular bands of RF radiation. Alternatively, gate cap 316 may have dimensions appropriate for whisker-type antenna structures. Any split gate structure known to be suitable antenna elements may also be implemented with one or more of gate electrode 315 and gate cap 316.

Material composition of gate cap 316 may be similarly modulated over a plurality of tunnel device structures, for example as another means of tuning various ones of the tunnel devices to couple particular bands of RF radiation. Compositional modulation may be employed in combination with gate cap $CD_T$ modulation, or employed in the alternative. In some examples, gate cap 316 employs more or less resistive materials to modulate antenna element impedance. Gate electrode 315 may have a fixed composition to simplify threshold voltage targeting, or the composition of gate electrode 315 may also vary (e.g., to match that of gate cap 316).

Figure 3D:
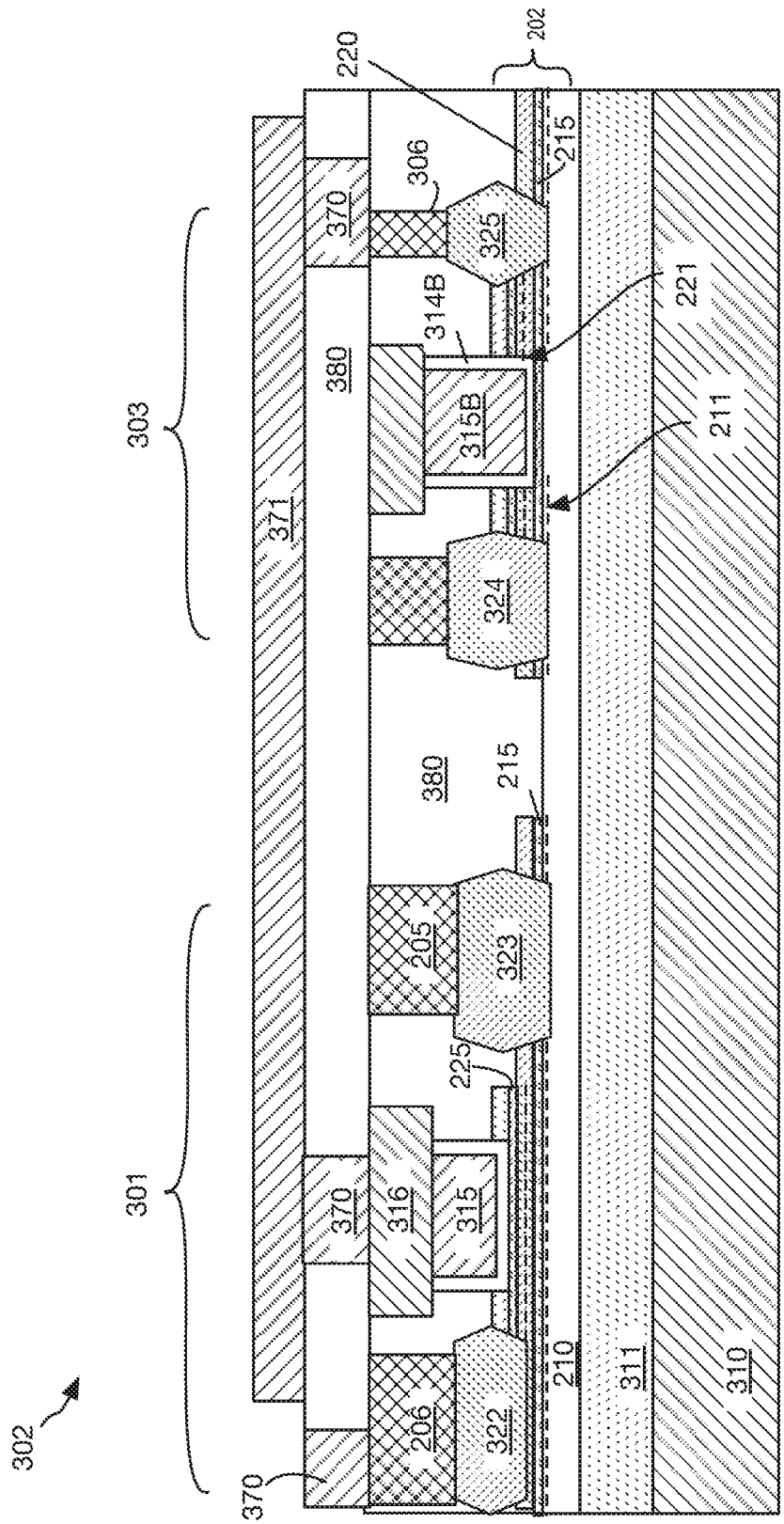
FIG. 3D is a cross-sectional profile view of a portion of an IC that includes both a III-N planar channel FET and a III-N tunnel device, in accordance with some embodiments.

III-N tunnel device structures according to embodiments herein are well suited for integrating with non-tunnel device structures. For example, in some further embodiments, an RFIC comprises both a III-N tunnel device structure and a planar III-N channel FET that employs only one of the carrier sheets employed by the tunnel device. FIG. 3D is a cross-sectional profile view of a portion of an IC 302 that includes both III-N tunnel device structure 301 and a planar III-N channel FET structure 303, in accordance with some embodiments. III-N tunnel device structure 301 may display highly non-linear transconductance (e.g., substantially as described above), while planar III-N channel FET structure 303 may display a transconductance that is significantly more linear. In the illustrated example, both device structures 301 and 303 include III-N heterostructure 202. III-N tunnel device structure 301 has all the features as described above in the context of FIG. 3A. III-N FET structure 303 is laterally adjacent to III-N tunnel device structure 301, over a second region of substrate 310.

III-N FET structure 303 includes a source 324 and a drain 325, both of which have access to 2 DEG 211. In the illustrated example source and drain 324, 325 are both embedded within well layer 210, substantially as described above for drain 323. In the context of III-N FET structure 303, well layer 210 is operable as a planar transistor channel in the context of III-N FET structure 303. Source and drain 324, 325 may have any of the properties described above for source and drain 322 and 323. In some exemplary embodiments, source and drains 322, 323, 324 and 325 all have substantially the same composition, doping and microstructure. III-N FET structure 303 further includes a gate electrode 315B separated from III-N heterostructure 202 by a gate dielectric 314B. Gate electrode 315B may have any suitable composition, such as any of those described above for gate electrode 315. In some embodiments gate electrodes 315 and 315B have the same composition. Gate dielectric 314B may have any suitable composition, such as any of those described above for gate dielectric 314. In some embodiments gate dielectric 314B has the same composition as gate dielectric 314. In the illustrated embodiment, gate electrode 315B is recessed through well layer 220, bifurcating 2 DEG 221. Gate electrode 315B may be recessed to any depth for desired control of 2 DEG 211. In the illustrated embodiment, 2 DEG 211 is depleted in the presence of gate electrode 315B, rendering III-N FET an enhancement mode device. 2 DEG 211 within well layer 210 may remain as an artifact of integration with tunnel device 301.

In alternative embodiments, a III-N FET structure integrated with a III-N tunnel device may employ the emitter 2 DEG (e.g., 2 DEG 221) rather than the collector 2 DEG (e.g., 2 DEG 211). For such embodiments, source and drain 324, 325 may access 2 DEG 221 substantially as illustrated for source 322 and gate electrode 315B may be recessed substantially as illustrated for gate electrode 315. Polarization layer 225 may then be operable as a back barrier in the context of the III-N FET structure. 2 DEG 211 within well layer 210 may remain as an artifact of integration with tunnel device 301.

In other embodiments, the III-N heterostructure of the III-N FET structure may differ from that of the tunnel device structure. For example, material layers above polarization layer 215 may be absent from the III-N FET structure with the source and drain embedded within well layer 210, which is operable as a channel in the context of the III-N FET structure.

Any terminal of III-N FET structure 303 may be electrically interconnected to any terminal of III-N tunnel device 301. In the illustrated embodiment, drain terminal 325 is coupled to gate electrode 315 through levels of interconnect metallization, which in this example include contact metallization 306, conductive vias 370 and interconnect line 371.

Figure 4:
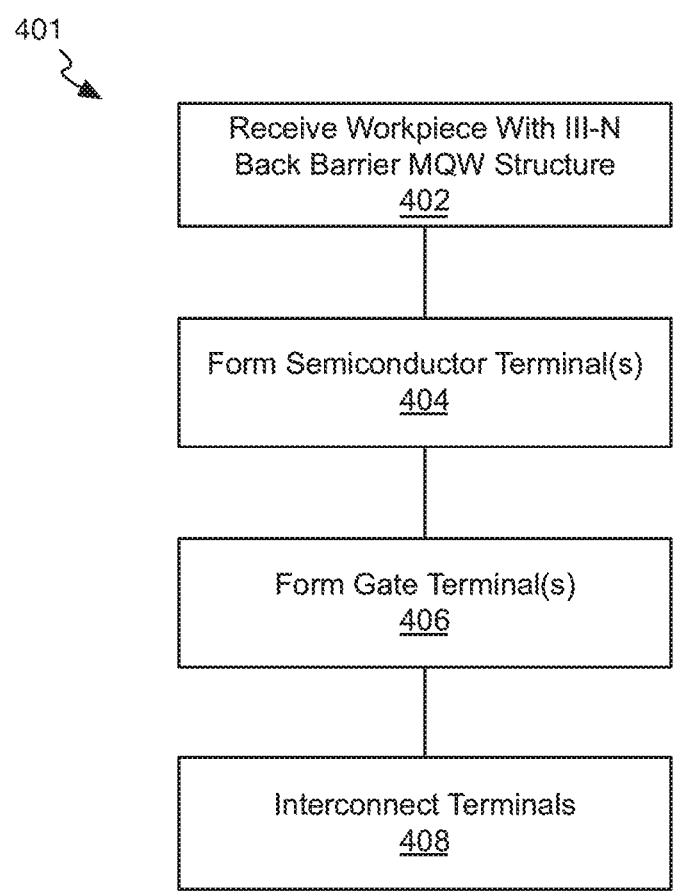
FIG. 4 is a flow diagram illustrating methods of forming III-N tunnel device structures, in accordance with some embodiments.

The tunnel device and IC structures described above may be fabricated according to a variety of techniques. FIG. 4 is a flow diagram illustrating methods 401 for forming an IC that includes III-N tunnel devices, in accordance with some embodiments.

Figure 5A:
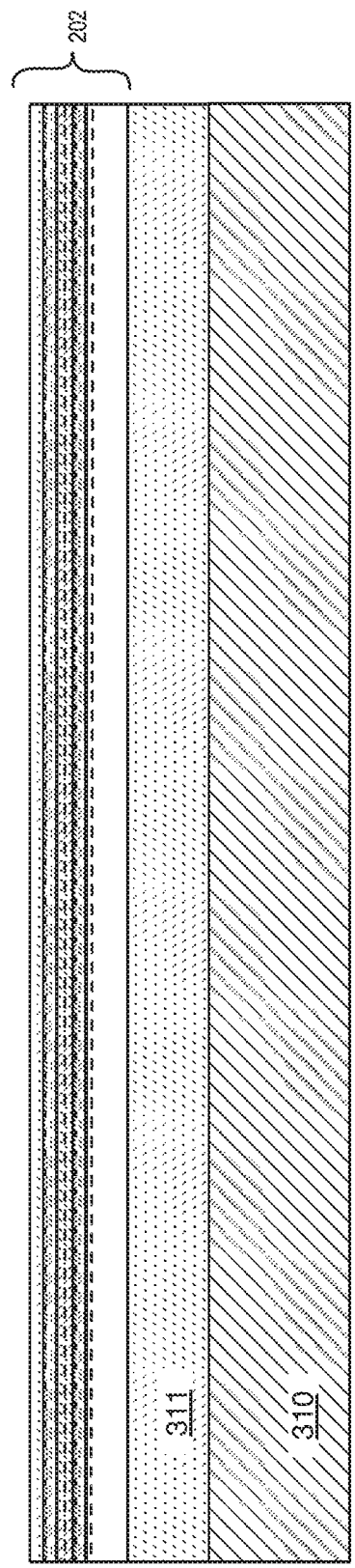
Figure 5B:
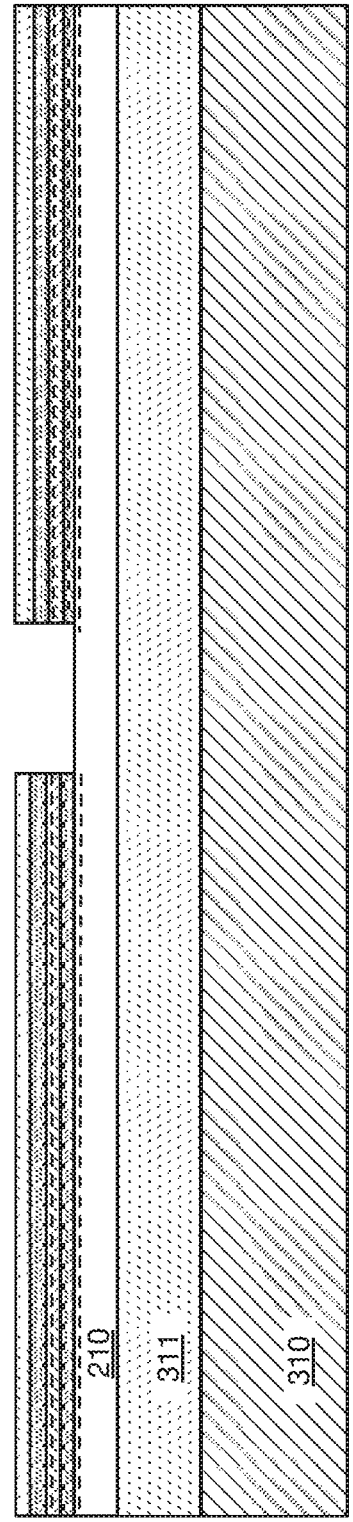

Methods 401 begin with receiving a workpiece at operation 402. Various epitaxial growth processes and/or fabrication processes may be employed upstream of methods 401 to prepare the workpiece received at operation 402. For some advantageous embodiments, the workpiece received at operation 402 comprises a substrate of crystalline group-IV materials (e.g., Si, Ge, SiGe). In some embodiments, the substrate received is a substantially monocrystalline (111) silicon substrate. Lattice mismatch between silicon and III-N crystals is most easily accommodated for the (111) plane. Nevertheless, other crystallographic orientations having greater lattice mismatch are also possible, such as, but not limited to, the (100), or (110) plane. A substrate may be bulk semiconductor or may be semiconductor on insulator (SOI). Substrate materials other than silicon are also possible, with examples including silicon carbide (SiC), sapphire, a III-V compound semiconductor (e.g., GaAs, InP). Substrates may have any level of impurity doping. Depending on the substrate, the workpiece received at operation 402 may include any number and/or thicknesses of III-N material layers. For example, the workpiece may include any III-N buffer architecture known to be suitable for the substrate, and may further include a III-N heterostructure with two or more quantum wells and two or more polarization layers, such as any of the heterostructures described above. FIG. 5A illustrates a portion of one exemplary workpiece that includes III-N heterostructure 202. The illustrated portion may be electrically isolated from other portions of the workpiece, for example with any shallow trench isolation (STI) process known in the art. In the example further illustrated in FIG. 5B, an isolation recess 505 is formed between a tunnel device region and a planar channel device region using any plasma or wet chemical etch process known to be suitable.

Figure 5C:
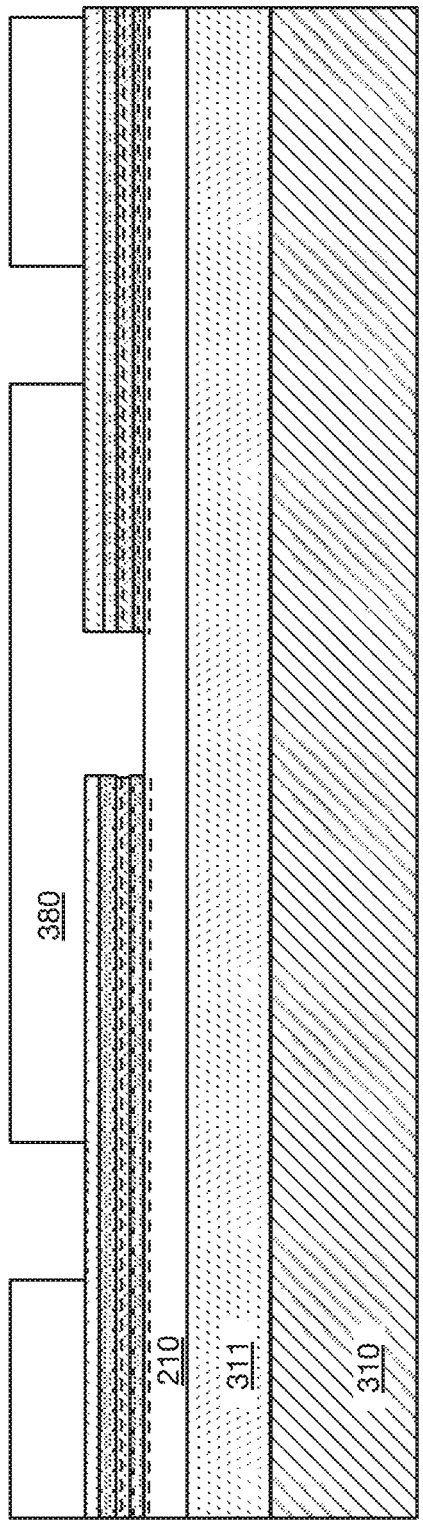
Figure 5D:
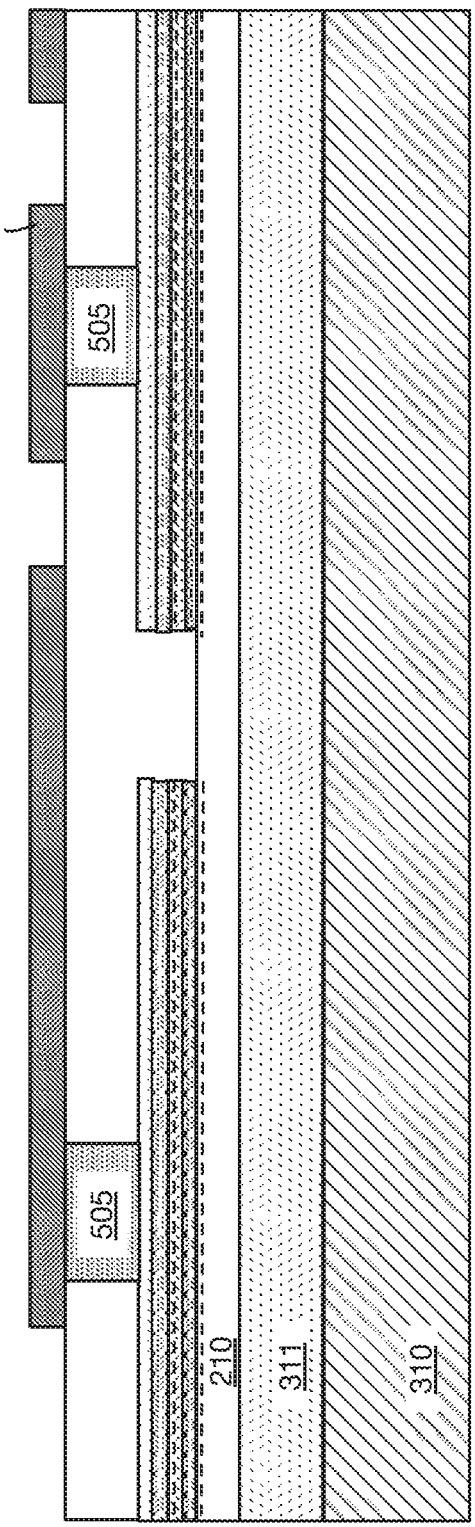

Returning to FIG. 4, methods 401 continue at operation 402 where the transistor semiconductor terminals are formed according to any suitable techniques. In the examples shown in FIG. 5C-5D, a sacrificial gate patterning process is employed to define gate terminal regions. As shown, sacrificial gate 505 is patterned, for example with any masking and etching process known to be suitable for the chosen sacrificial material. Masking may comprise hardmasks and/or photodefinable materials. Etching may comprise wet chemical or dry (plasma) etch processes, for example. As further illustrated in FIG. 5D an etch mask 510 is deposited. Etch mask 510 may have openings aligned where first source/drain regions are to be formed.

Figure 5E:
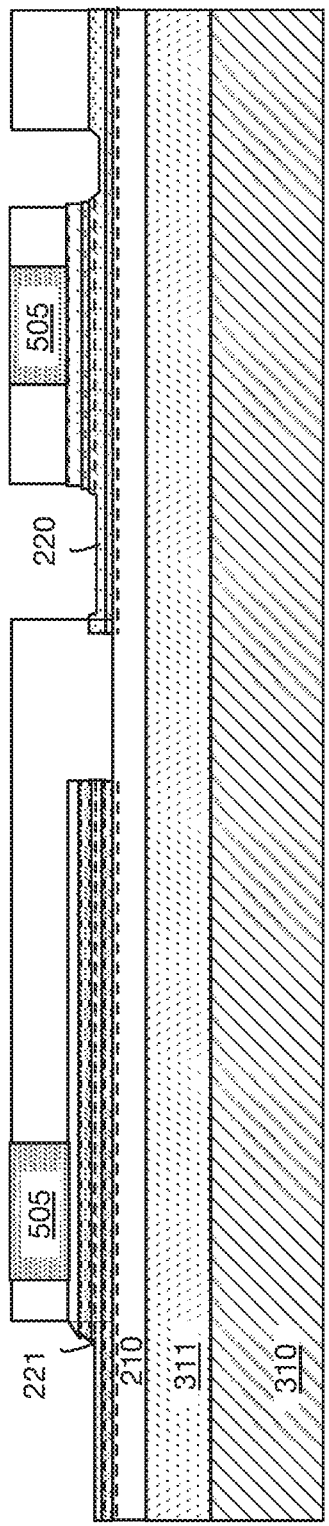

As further illustrated in FIG. 5E, any suitable, III-N material is patterned, for example in alignment with an outer edge of mask 510. Any wet chemical or dry etch process known to be suitable for the III-N material(s) may be employed, for example to reveal well layer 220, and/or etch into well layer 220 to reveal a sidewall that intersects 2 DEG 221.

Figure 5F:
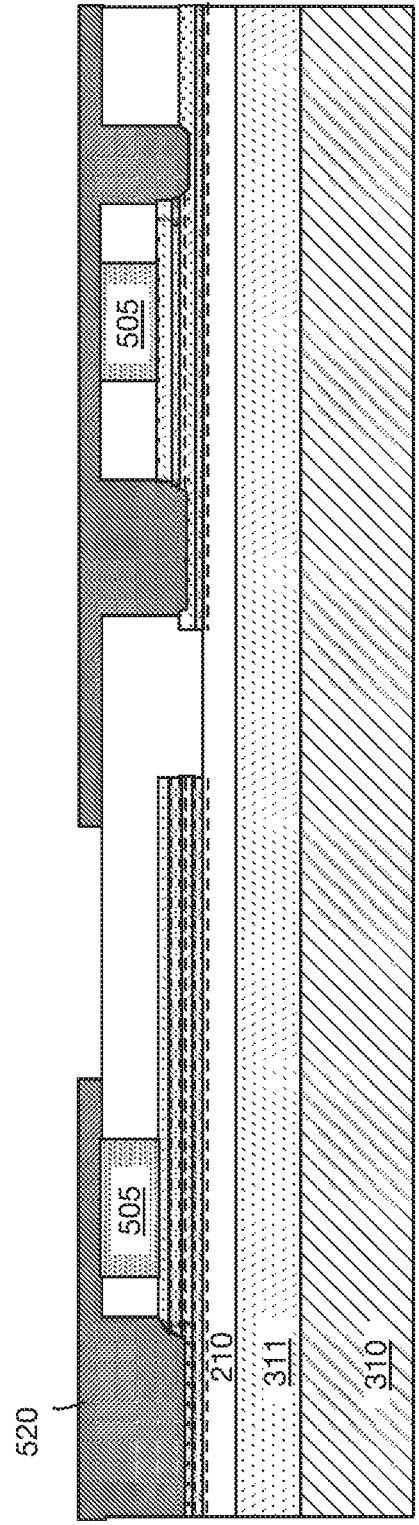
Figure 5G:
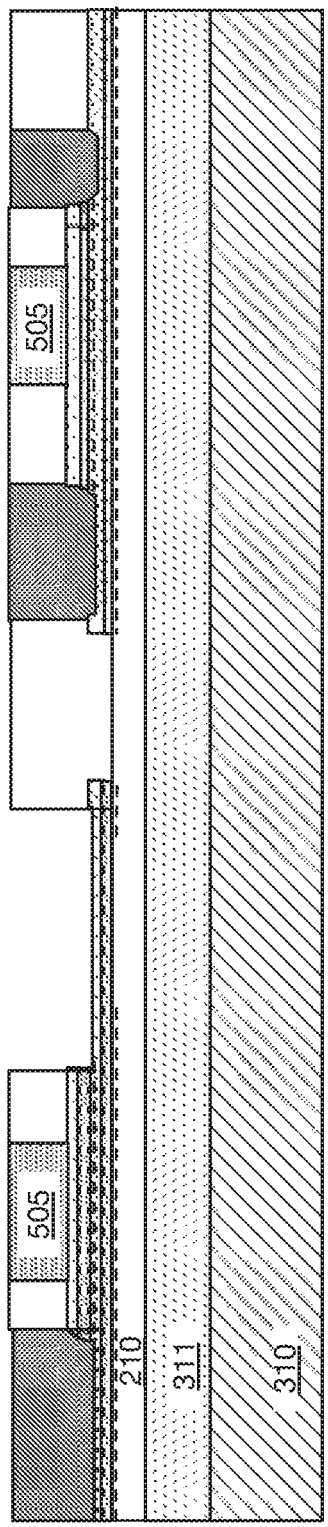
Figure 5H:
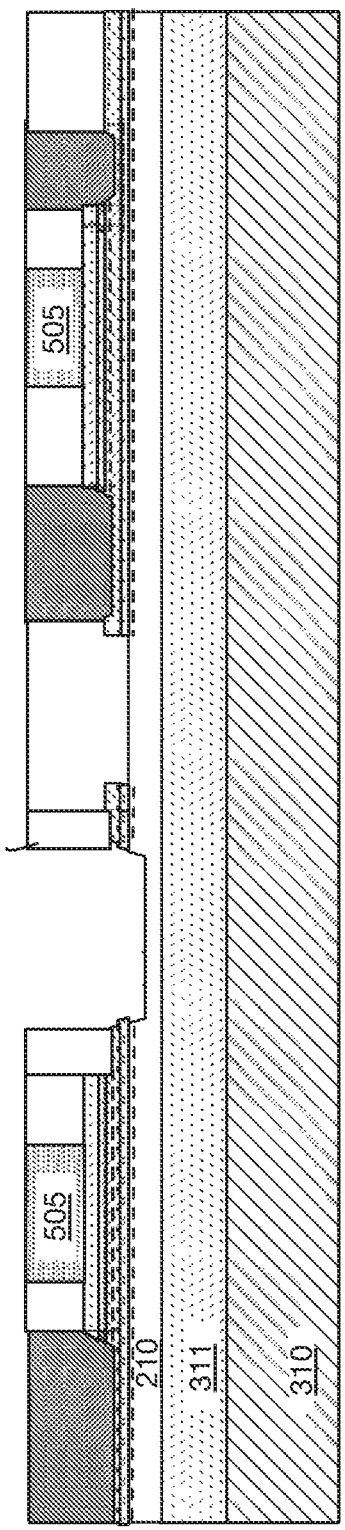
Figure 5I:
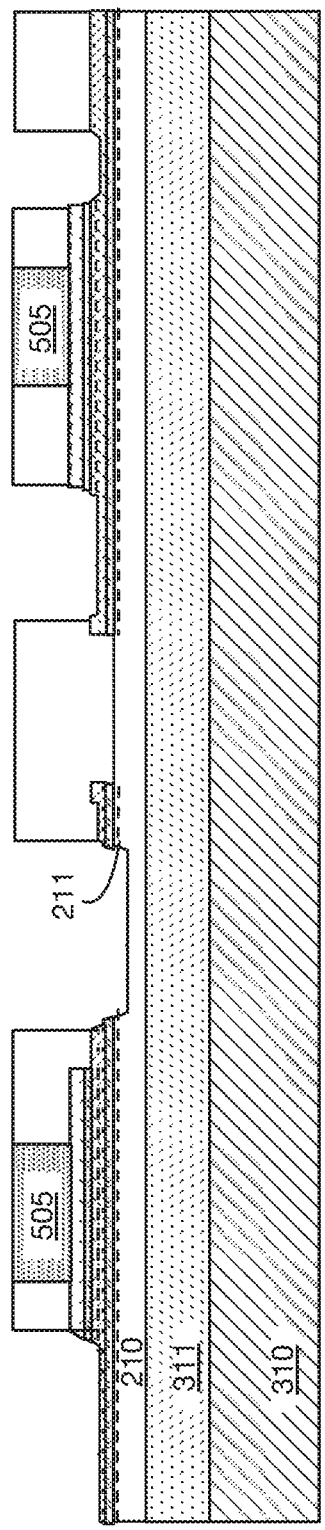

As further illustrated in FIG. 5F an etch mask 520 is deposited. Etch mask 520 may have openings aligned where second source/drain regions are to be formed. As further illustrated in FIG. 5G, III-N material(s) are patterned again with any wet chemical or dry etch process known to be suitable, for example to remove polarization layer 225. Etch mask 520 may be planarized with top surface of sacrificial gate structure 505 and a dielectric spacer process (e.g., conformal dielectric film deposition and anisotropic etching of the conformal film) may then be employed to form a drain spacer 530 adjacent to a sidewall of the drain opening, as shown in FIG. 5H. Next, as further illustrated in FIG. 5I, additional III-N material may then be etched to reveal well layer 210, and/or etch into well layer 210 to reveal a sidewall that intersects 2 DEG 211.

Figure 5J:
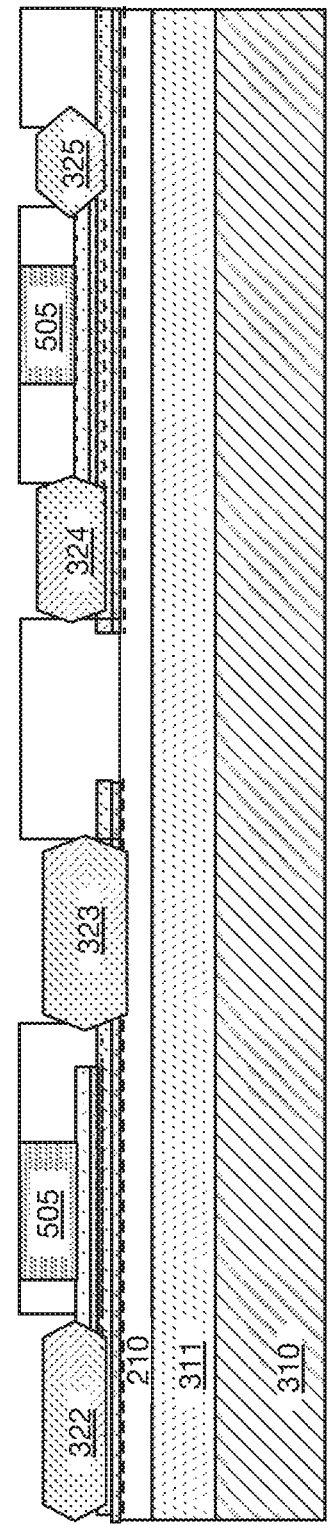

As further illustrated in FIG. 5J, mask material is stripped, and semiconductor material (e.g., any of those described above) is then deposited or epitaxial grown within the source and drain openings for form source/drains 322-325. One or more dielectric deposition processes and/or planarization processes may then be performed to arrive at the structure shown in FIG. 5K in preparation for a gate replacement process.

Returning to FIG. 4, methods 401 continue at operation 406 where a gate terminals are formed in a manner suitable for both tunnel devices and planar channel devices. In the exemplary embodiments further illustrated in FIG. 5L-5N, gate recesses are patterned into polarization material layers 230 and/or 225. Multiple etch masks 535A (FIG. 5L) and 535B (FIG. 5M) may be employed to target different gate recess depths, if desired. As shown in FIG. 5L, a first gate stack including both gate dielectric 314B and gate electrode 315B is formed by patterning a mask 535A that exposes at least one sacrificial gate 505 to any suitable gate replacement process. Gate dielectric 314B and gate electrode 315B may then be deposited into the gate recess with any technique(s) suitable for their compositions (e.g., chemical vapor deposition, atomic layer deposition, etc.). Overburden from formation of the first gate stack may be subsequently removed, for example with a planarization process that exposes mask 535A.

Figure 5M:
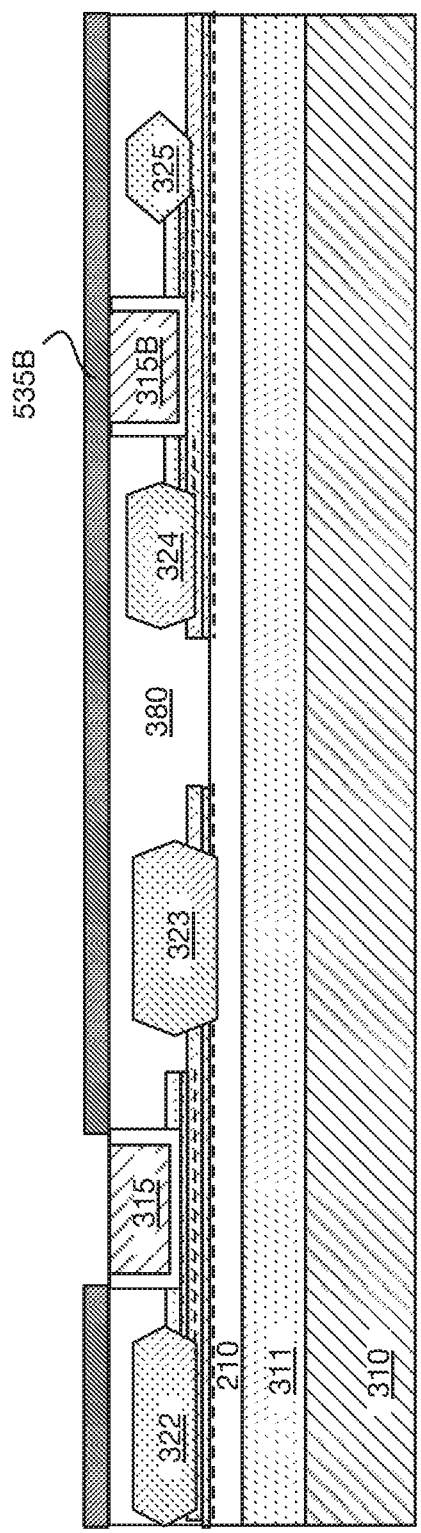
Figure 5N:
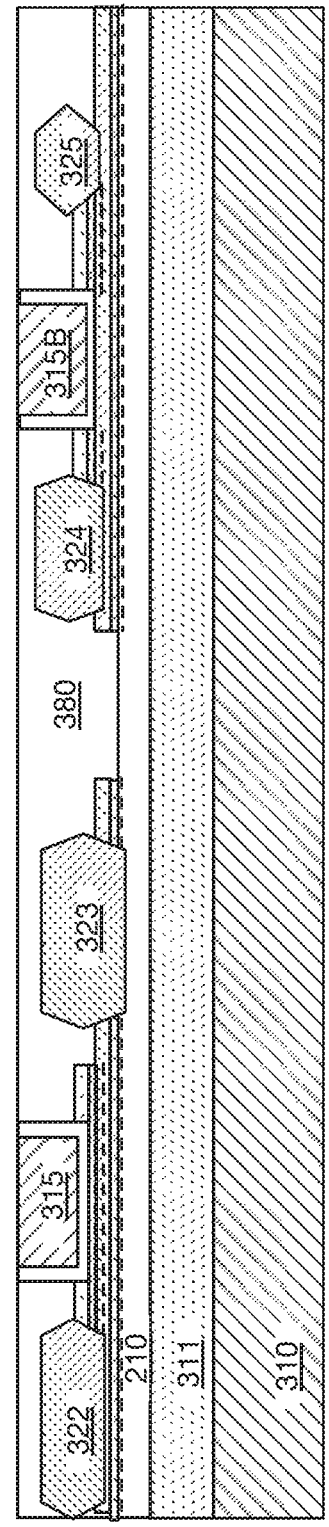

Mask 515A is then replaced with a mask 515B, which is patterned to expose at least one other sacrificial gate 505, as further illustrated in FIG. 5M. Another gate stack including gate dielectric 314 and gate electrode 315 is then formed with any suitable gate replacement process. During gate replacement, III-N material 310 may be etched to recess the gate stack by another amount, for example suitable for a tunnel device. Gate dielectric 314 and gate electrode 315 may be deposited into the gate recess with any techniques suitable for their composition. Overburden from formation of the next gate stack may be subsequently removed, for example with a planarization process that exposes mask 535B. Mask 353B may then be stripped.

Figure 5O:
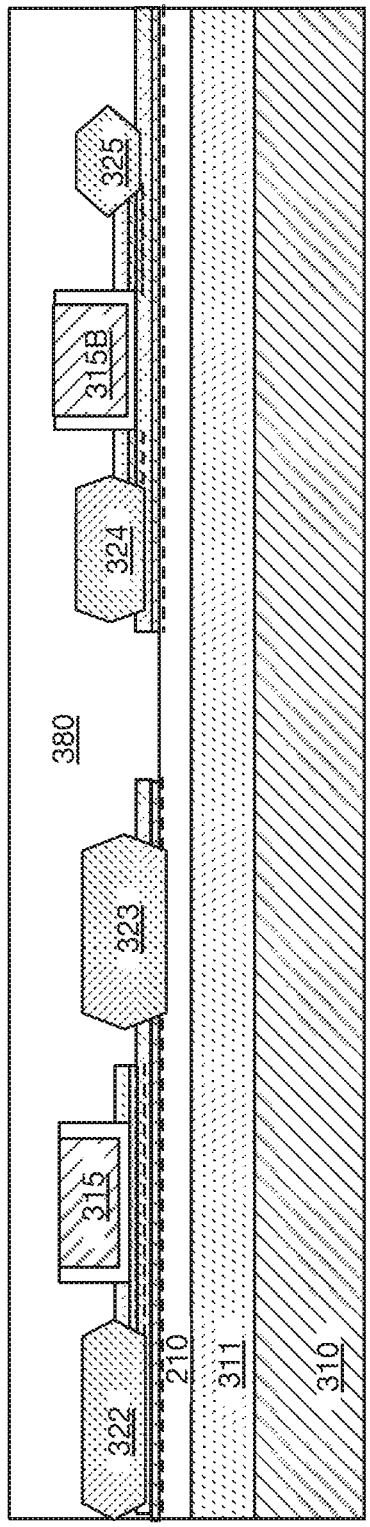
Figure 5P:
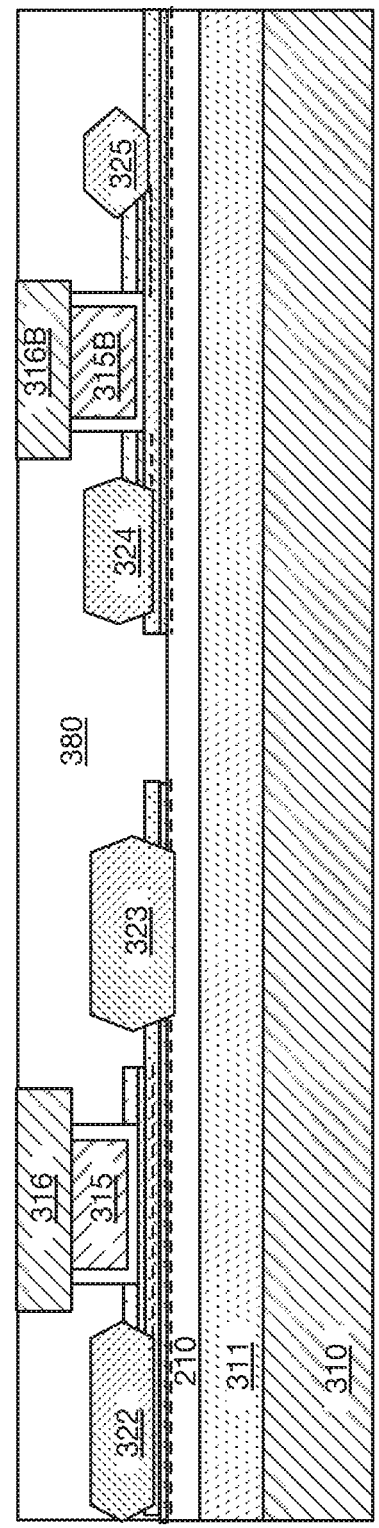

Gate electrodes may then be capped, for example by practicing a damascene interconnect metallization process. For example, in FIG. 5O, additional dielectric material 380 is deposited over the gate electrodes 315 and 315B. Openings formed in dielectric material 380 that expose gate electrodes 315 and 315B are then filled with metallization to form gate caps 316 and 316B of any desired lateral dimension. A planarization process may remove overburden to arrive at the structure illustrated in FIG. 5P.

Figure 5Q:
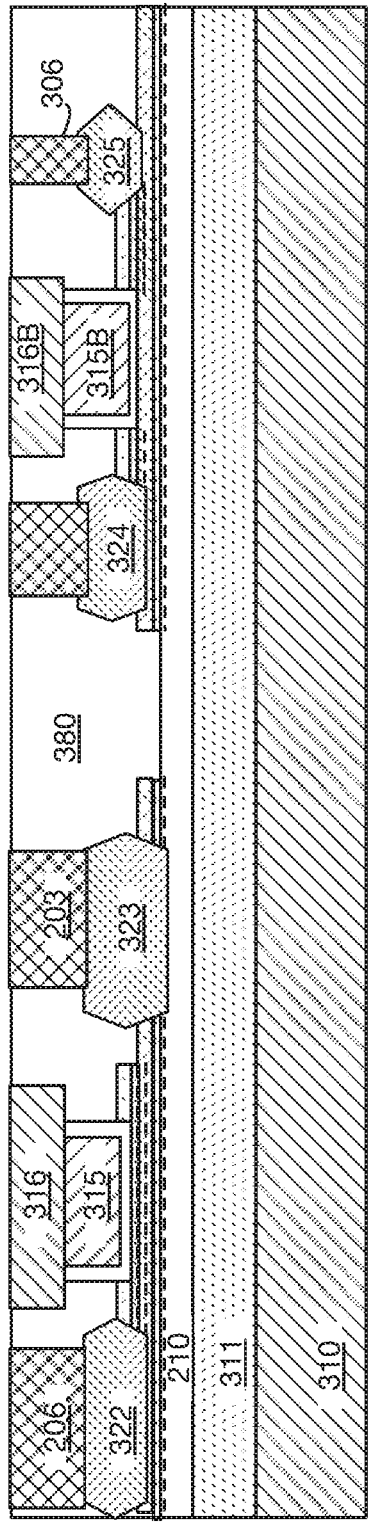
Figure 5R:
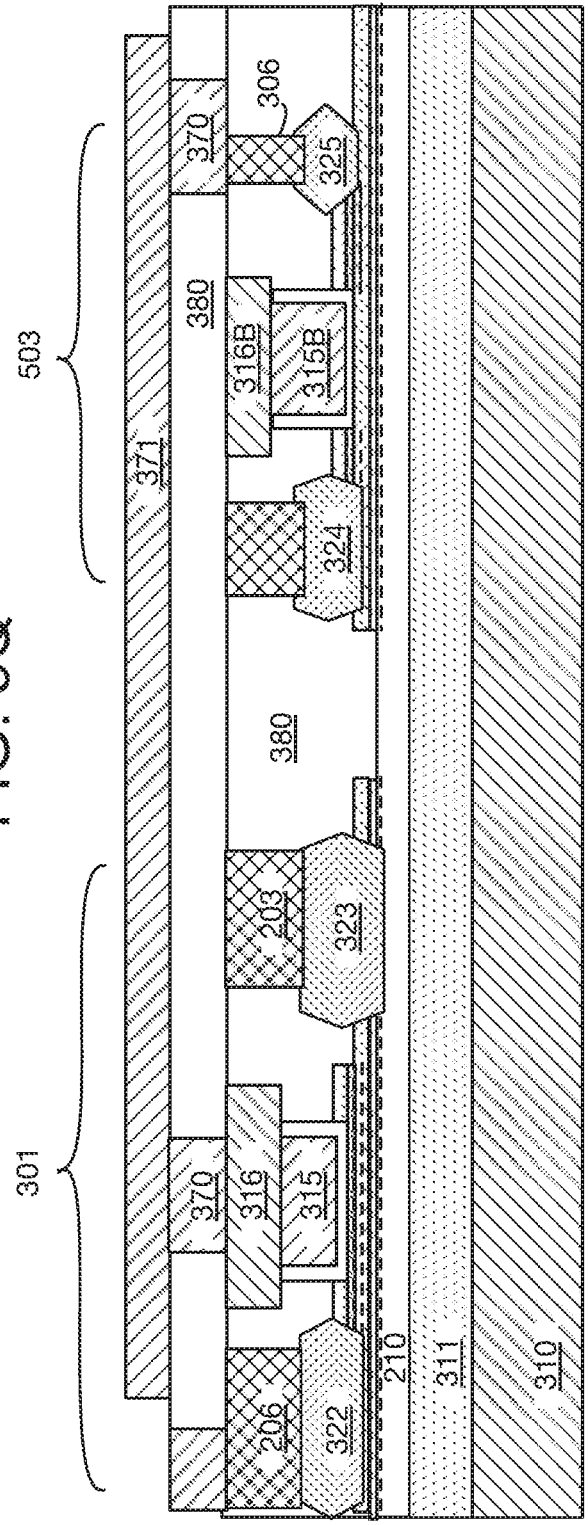

Returning to FIG. 4, methods 401 continue at operation 408 where device terminals are interconnected into any suitable circuit, such as a frequency mixer or frequency detector. Any suitable backend of line (BEOL) process(es) may be utilized to interconnect terminals of tunnel devices and/or planar channel devices. In the example further illustrated in FIG. 5Q-5R, damascene processing techniques are further employed to form T-gate structures, conductive vias and conductive lines. In reference to FIG. 5Q, dielectric material 380 may be patterned to expose semiconductor terminals 322-325 within openings that are backfilled with terminal metallization 203, 206 and 306. In reference to FIG. 5R, interconnection of device terminals is completed with further formation of conductive vias 370 and patterning of interconnect metallization 371 to arrive at a structure similar to that introduced above in FIG. 3D. One difference being that the planar FET 503 illustrated in FIG. 5R is coupled to 2 DEG 221, rather than 2 DEG 211. FIG. 5R therefore further illustrates another exemplary planar FET structure 503 that may be integrated with III-N tunnel device structure 301.

Methods 401 (FIG. 4) are then complete and any other known processing may be performed to complete an IC incorporating III-N tunnel device structure. Notably, no particular order is required by methods 401. For example, the operations illustrated in FIG. 4 are numbered consecutively for the sake of discussion, and the associated operations need not be so ordered.

Figure 6:
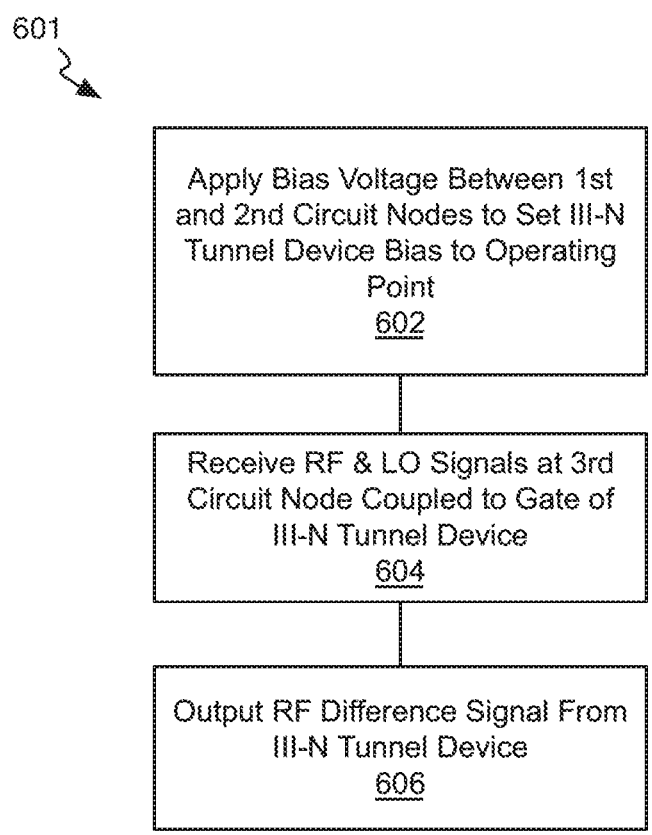
FIG. 6 is a flow diagram illustrating methods of mixing an RF signal with a local oscillator (LO) signal, in accordance with some embodiments.

The III-N tunnel device structures described above may be operated in a device platform, such as a mobile handset, according to a variety of techniques. FIG. 6 is a flow diagram illustrating methods 601 for mixing an RF signal with an LO signal, in accordance with some embodiments. Methods 601 may be performed, for example during operation of an RF receiver. In some embodiments, methods 601 are performed by hardware within a mobile handset. Methods 601 may be stored on a computer readable medium, for example, and accessed during operation of the RF receiver.

Methods 601 begin at operation 602 where a bias voltage is applied between a first node of a circuit coupled to a source or emitter terminal of a III-N tunnel device, and a second node of the circuit coupled to a drain or collector terminal of the III-N tunnel device. The tuning bias voltage applied at operation 602 is to set the III-N tunnel device to an operating point within a non-linear regime. At operation 604, an RF signal and an LO signal is received at a third circuit node, which is coupled to a gate of the III-N tunnel device. If the III-N tunnel device is a diode, the RF signal may be received instead into the first circuit node. In some embodiments, the RF signal is received from a noise amplifier. In exemplary embodiments the RF and LO signals both exceed 1 GHz (e.g., 1.6 GHz, 2-2.4 GHz, 3.5 GHz). At operation 606, a difference of the LO and RF signal is conveyed to the second circuit node through a tunnel barrier of the III-N tunnel device.

Figure 7:
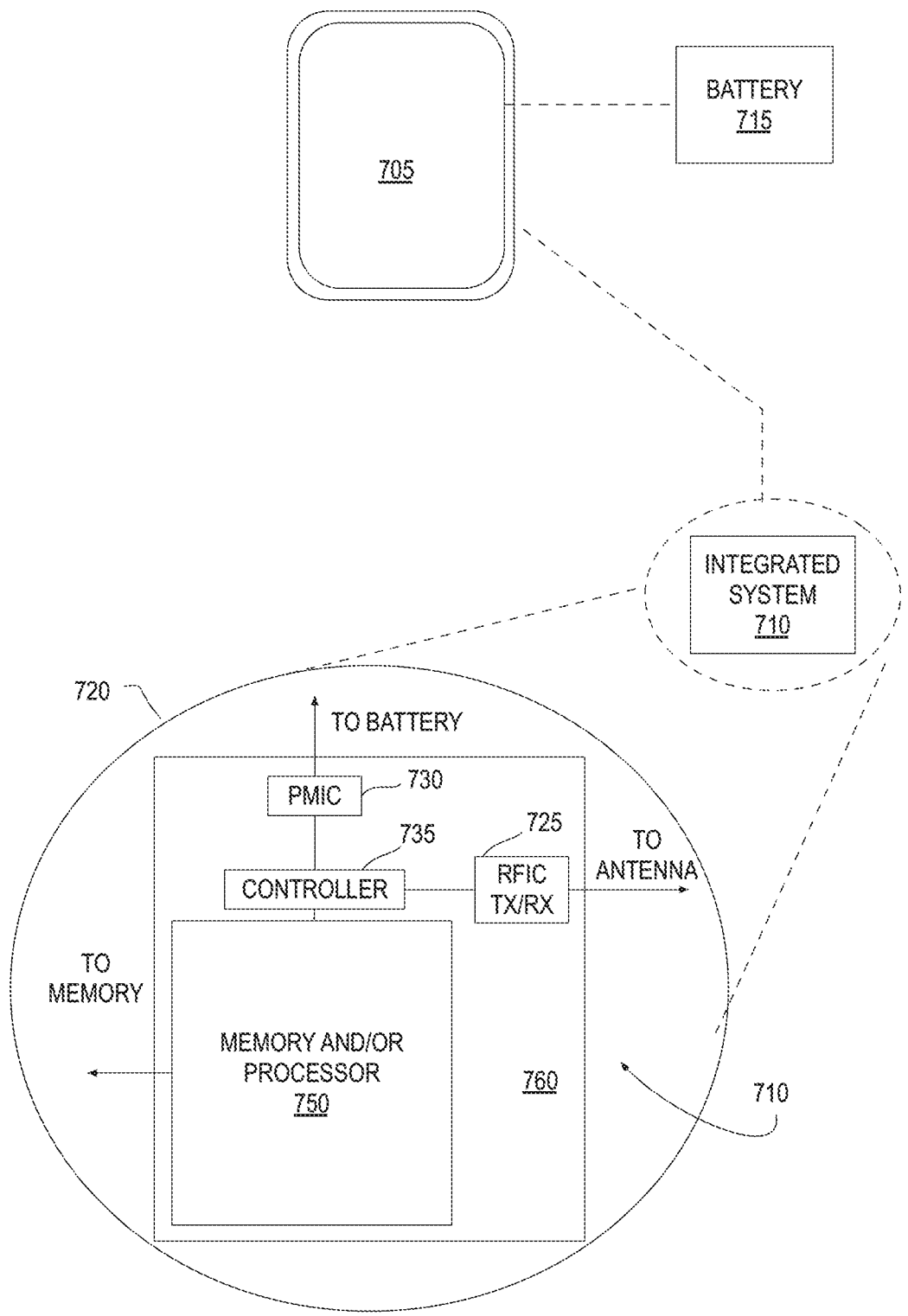
FIG. 7 illustrates a mobile computing platform and a data server machine employing an SoC including circuitry with III-N tunnel devices, in accordance with embodiments.

FIG. 7 illustrates a mobile computing platform 705 that employs an RFIC including a III-N tunnel device structure, for example as described elsewhere herein. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone packaged chip, IC 750 may include memory (e.g., RAM), and/or a processor chip (e.g., a microprocessor, a multi-core microprocessor, graphics processor, or the like) including a III-N tunnel device structure, for example as described elsewhere herein. IC 750 may be further coupled to a board, a substrate, or an interposer 760 along with one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735 thereof. One or more of PMIC 730 and RFIC 725 may in addition, or in the alternative, include a III-N tunnel device structure, for example as described elsewhere herein.

Functionally, PMIC 730 may perform battery power regulation, DC-to-DC conversion, etc., and so has an input coupled to battery 717 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the IC 750 or within a single IC coupled to the package substrate of the IC 750.

Figure 8:
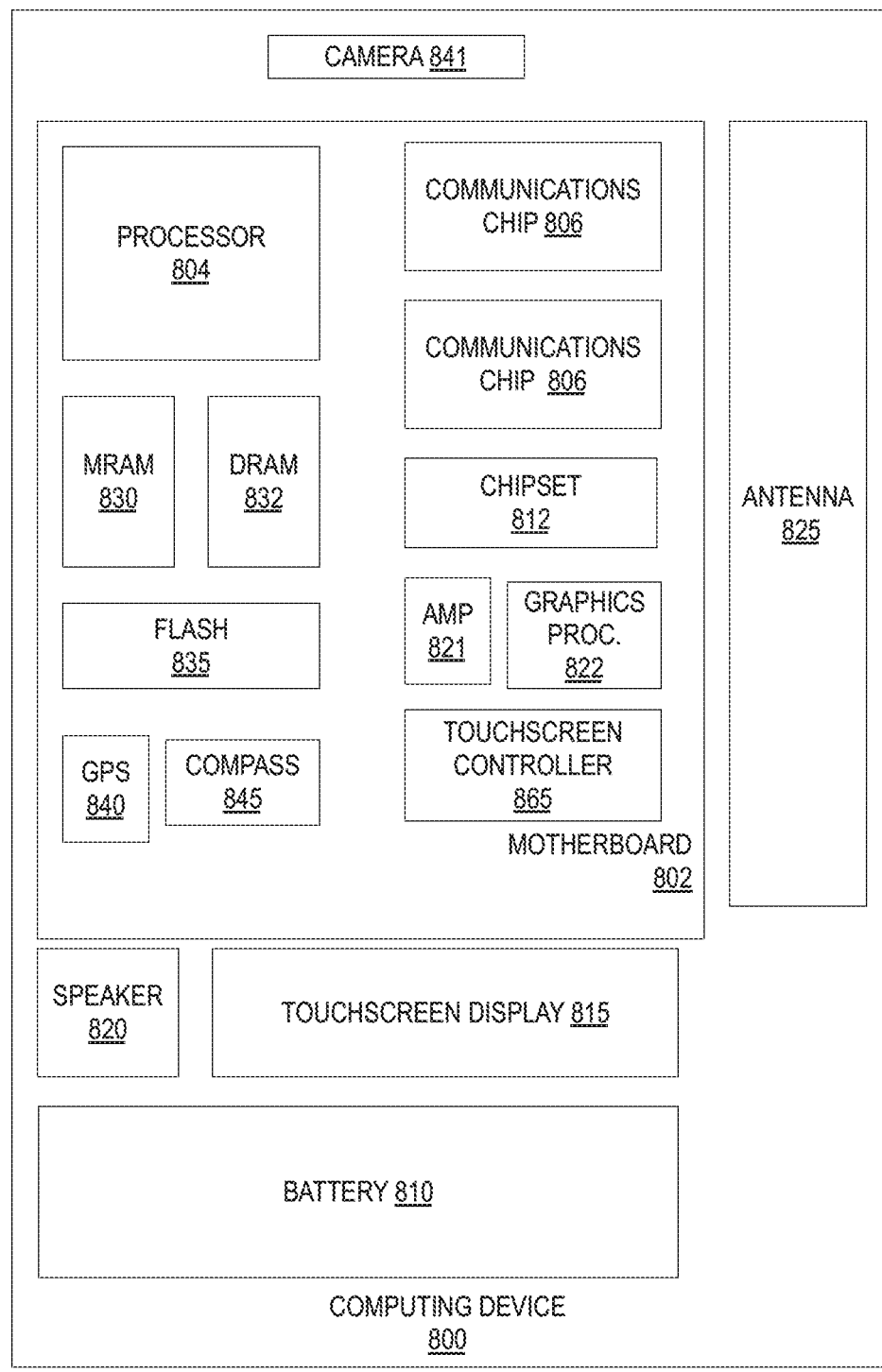
FIG. 8 is a functional block diagram of an electronic computing device, in accordance with some embodiments.

FIG. 8 is a functional block diagram of a computing device 800, arranged in accordance with at least some implementations of the present disclosure. Computing device 800 may be found inside platform 705, for example. Device 800 further includes a motherboard 802 hosting a number of components, such as, but not limited to, a processor 804 (e.g., an applications processor), which may further incorporate a III-N tunnel device structure, for example as described elsewhere herein. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM 832), non-volatile memory (e.g., MRAM 830), flash memory 835, a graphics processor 822, a digital signal processor, a crypto processor, a chipset 812, an antenna 825, touchscreen display 815, touchscreen controller 865, battery 810, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), or the like).

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. One or more of communication chips 806 may include a III-N tunnel device, for example as described elsewhere herein.

Figure 9:
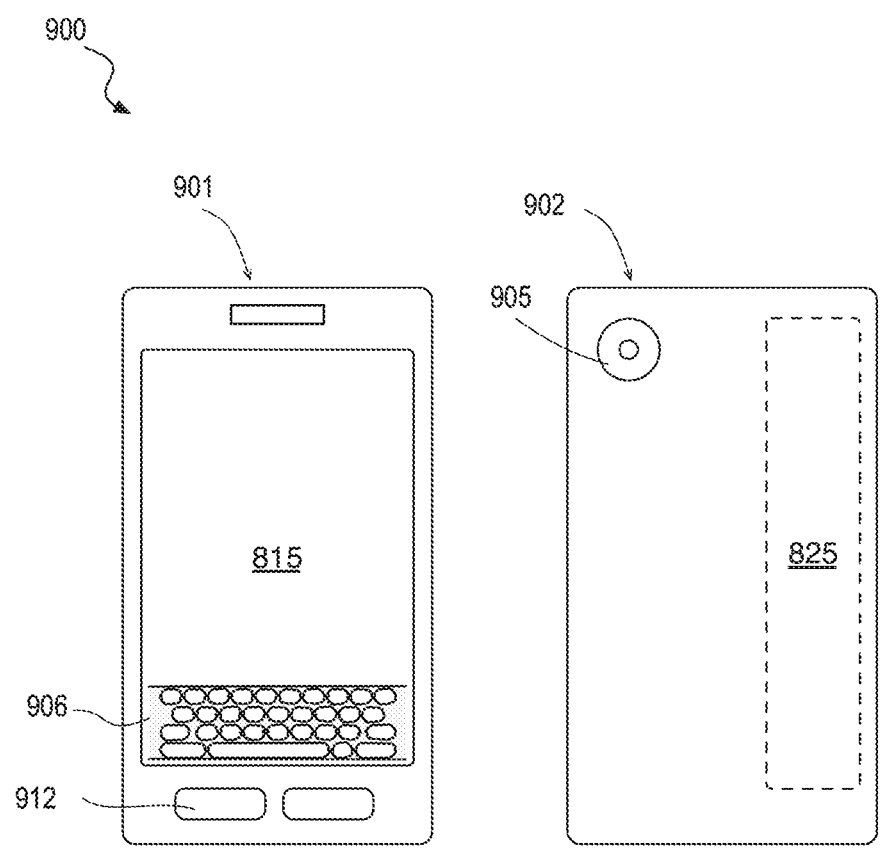
FIG. 9 is a diagram of an exemplary mobile handset platform including a III-N tunnel device structure, in accordance with some embodiments

As described above, device 800 may be embodied in varying physical styles or form factors. FIG. 9 illustrates embodiments of a mobile handset device 900 in which device 800 may be embodied. In embodiments, device 900 may be implemented as a mobile computing device having wireless capabilities. A mobile computing device may refer to any device having a processing system and a mobile power source or supply, such as one or more batteries, for example. Examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smartphone, tablet or smart television), mobile internet device (MID), messaging device, data communication device, and so forth. Examples of a mobile computing device also may include computers and/or media capture/transmission devices configured to be worn by a person, such as a wrist computer, finger computer, ring computer, eyeglass computer, belt-clip computer, armband computer, shoe computers, clothing computers, and other wearable computers. In various embodiments, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 9, mobile handset device 900 may include a housing with a front 901 and back 902. Device 900 includes display 815, an input/output (I/O) device 906, and integrated antenna 825. Device 900 also may include navigation features 912. Display 815 may include any suitable display unit for displaying information appropriate for a mobile computing device. I/O device 906 may include any suitable I/O device for entering information into a mobile computing device. Examples for I/O device 906 may include an alphanumeric keyboard, a numeric keypad, a touch pad, input keys, buttons, switches, microphones, speakers, voice recognition device and software, and so forth. Information also may be entered into device 900 by way of microphone (not shown), or may be digitized by a voice recognition device. Embodiments are not limited in this context. Integrated into at least the back 902 is camera 905 (e.g., including one or more lenses, apertures, and image sensors).

Embodiments described herein may be implemented using hardware elements, software elements, or a combination of both. Examples of hardware elements or modules include: processors, microprocessors, circuitry, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software elements or modules include: applications, computer programs, application programs, system programs, machine programs, operating system software, middleware, firmware, routines, subroutines, functions, methods, procedures, software interfaces, application programming interfaces (API), instruction sets, computing code, computer code, code segments, computer code segments, data words, values, symbols, or any combination thereof. Determining whether an embodiment is implemented using hardware elements and/or software elements may vary in accordance with any number of factors considered for the choice of design, such as, but not limited to: desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable storage medium. Such instructions may reside, completely or at least partially, within a main memory and/or within a processor during execution thereof by the machine, the main memory and the processor portions storing the instructions then also constituting a machine-readable storage media. Programmable logic circuitry may have registers, state machines, etc. configured by the processor implementing the computer readable media. Such logic circuitry, as programmed, may then be understood to have been physically transformed into a system falling within the scope of the embodiments described herein. Instructions representing various logic within the processor, which when read by a machine may also cause the machine to fabricate logic adhering to the architectures described herein and/or to perform the techniques described herein. Such representations, known as cell designs, or IP cores, may be stored on a tangible, machine-readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments other than those described in detail above may be practiced with modification and alteration without departing from the scope of the appended claims. For example the above embodiments may include specific combinations of features as further provided below:

In first examples, a Group III-Nitride (III-N) device, comprises a III-N heterostructure comprising a first well layer between first and second polarization layers, wherein the first and second polarization layers each have a larger bandgap than the first well layer, and wherein the first polarization layer induces a first charge carrier gas within the first well layer, and a second well layer separated from the first well layer by a tunnel barrier comprising at least the second polarization layer, wherein the second polarization layer has a larger bandgap than the second well layer, and wherein the second polarization layer induces a second carrier gas within the second well layer. The III-N device comprises first terminal electrically coupled to the first carrier gas, and a second terminal electrically coupled to the second carrier gas, wherein the second terminal is electrically coupled to the first terminal through a tunnel barrier comprising the second polarization layer.

In second examples, for any of the first examples, the second well layer has a larger bandgap than the first well layer.

In third examples, for any of the first through second examples the second well layer comprises more Al than the first well layer, and the first and second polarization layers comprise more Al than the first and second well layers.

In fourth examples, for any of the first through third examples an individual one of the first and second carrier gases is a two-dimensional electron gas (2 DEG). A c-plane of the III-N heterostructure is no more than 10° from parallel to plane of an underlying substrate, and at least one of the well layers comprises binary GaN.

In fifth examples, for any of the fourth examples the first well layer comprises binary GaN, and the second well layer comprises $Al_xGa_{1-x}N$ with x between 0.02 and 0.07.

In sixth examples, for any of the first through fifth examples the second polarization layer has a thickness less than 2 nm, and the first and second well layers have a thickness more than 2 nm.

In seventh examples, for any of the first through sixth examples the first terminal comprises a source, the second terminal comprises a drain laterally spaced apart from the source, and the III-N device further comprises a gate terminal within a space between the source and drain and capacitively coupled to at least one of the first and second well layers to modulate at least one of the first and second charge carrier gases by an electric field.

In eighth examples, for any of the seventh examples the gate terminal comprises a gate electrode separated from the first well layer by at least a gate dielectric, the gate dielectric further comprising at least a metal and oxygen.

In ninth examples, for any of the seventh through eighth examples the source is in contact with the first well layer, but not in contact with the second carrier gas, and the drain is in contact with the second well layer, but not in contact with the first carrier gas.

In tenth examples, for any of the ninth examples the source is separated from the second well layer by at least the second polarization layer, and the drain extends through the second polarization layer.

In eleventh examples, for any of the seventh through tenth examples the device further comprises an isolation feature between the gate terminal and the drain, the isolation feature electrically isolating the drain from the first carrier gas.

In twelfth examples, a radio frequency (RF) mixer comprises input terminals to receive first and second input signals, an output terminal to provide an output signal, a Group III-Nitride (III-N) device coupled to the input and output terminals, wherein the III-N device comprises a first two-dimensional electron gas (2 DEG) and a second 2 DEG with a tunnel barrier therebetween, and a bias voltage supply coupled across a first terminal of the III-N device and a second terminal of the III-N device, wherein the III-N device is to conduct a current between the first and second terminals and through the tunnel barrier in response to the first and second input RF signals, and wherein the current is indicative of a difference between the input RF signals.

In thirteenth examples, for any of the twelfth examples the III-N device comprises a tunnel transistor, and the first terminal comprises a first of a source or drain, the second terminal comprises a second of the source or drain, the second terminal is coupled to the output terminal, and a gate electrode is coupled to the input terminals.

In fourteenth examples, for any of the thirteenth examples the gate electrode comprises a T-structure further comprising a pedestal proximal to the first well layer, and a cap distal from the first well layer, wherein the cap has a lateral dimension larger than that of the pedestal and is operable as an antenna element sensitive to RF within a GHz frequency band.

In fifteenth examples, for any of the twelfth through fourteenth examples, the gate electrode is a first gate electrode operable as an antenna element sensitive to RF within a first GHz frequency band, the RF mixer further comprises a second III-N device, and the second III-N device further comprises a second gate electrode, wherein a cap of the second gate electrode has a lateral dimension different from that of the first gate electrode, and is operable as an antenna element sensitive to RF within a second GHz frequency band.

In sixteenth examples, for any of the twelfth through fifteenth examples the III-N device comprises a III-N heterostructure, the III-N heterostructure further comprising a first well layer between first and second polarization layers having a larger bandgap than the first well layer, wherein the first polarization layer induces the first 2 DEG within the first well layer. The III-N heterostructure further comprises a second well layer separated from the first well layer by the tunnel barrier, the tunnel barrier comprising at least the second polarization layer, wherein the second polarization layer has a larger bandgap than the second well layer, and wherein the second polarization layer induces the second 2 DEG within the second well layer.

In seventeenth examples, a radio frequency (RF) integrated circuit (IC), comprises a local oscillator and an amplifier. The amplifier further comprises a first Group III-N (III-N) field effect transistor (FET), the first III-N FET comprising a first source, a first drain, and a first gate electrode therebetween, a first polarization layer comprising a first III-N material, and a first channel layer comprising a second III-N material, wherein a carrier gas within the first channel layer is to couple the first source to the first drain as a function of a first voltage of the first gate electrode. The RFIC also comprises an RF mixer coupled to receive a first signal from the local oscillator, and to receive a second signal from the amplifier. The RF mixer further comprises a second III-N FET, the second FET comprising a second source, a second drain, and a second gate electrode therebetween, a second polarization layer comprising a third III-N material, and a second channel layer comprising a fourth III-N material. The carrier gas within the first channel layer is coupled to the second source, and is to couple through the second polarization layer to a second carrier gas within the second channel layer as a function of a second voltage of the second gate electrode. The carrier gas within the second channel layer is coupled to the second drain.

In eighteenth examples, for any of the seventeenth examples the first III-N FET has a first transconductance, the second III-N FET has a second transconductance, and wherein the second transconductance is more non-linear than the first transconductance.

In nineteenth examples, for any of the seventeenth through eighteenth examples the oscillator is operable at a frequency band of at least 75 GHz.

In twentieth examples, for any of the seventeenth through eighteenth examples the amplifier is operable at a frequency band of at least 75 GHz.

In twenty-first examples, a method of transforming a radio frequency (RF) signal comprises receiving a local oscillator (LO) signal and an RF signal at a first circuit node. The first circuit node is coupled to a gate electrode of a Group III-Nitride (III-N) device, wherein the III-N device comprises a first two-dimensional electron gas (2 DEG) and a second 2 DEG with a tunnel barrier therebetween. The method further comprises applying a bias voltage between a source of the III-N device and a drain of the III-N device, and conducting a current from the source, through the tunnel barrier, and to the drain, wherein the current is indicative of a difference between the RF signal and the LO signal.

In twenty-second examples for any of the twenty-first examples the method further comprises receiving an input RF signal with an antenna, amplifying the input RF signal to the first RF signal with a circuit comprising a III-N field effect transistor, and generating the second RF signal with a local oscillator.

However, the above embodiments are not limited in this regard and, in various implementations, the above embodiments may include the undertaking of only a subset of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A Group III-Nitride (III-N) device, comprising:
   a III-N heterostructure comprising:
      a first well layer between first and second polarization layers, wherein the first and second polarization layers each have a larger bandgap than the first well layer, and wherein the first polarization layer induces a first charge carrier gas within the first well layer; and
      a second well layer separated from the first well layer by a tunnel barrier comprising at least the second polarization layer, wherein the second polarization layer has a larger bandgap than the second well layer, and wherein the second polarization layer induces a second charge carrier gas within the second well layer;
   a first terminal electrically coupled to the first charge carrier gas; and
   a second terminal electrically coupled to the second charge carrier gas, wherein the second terminal is electrically coupled to the first terminal through a tunnel barrier comprising the second polarization layer.

2. The III-N device of claim 1, wherein the second well layer has a larger bandgap than the first well layer.

3. The III-N device of claim 1, wherein:
   the second well layer comprises more Al than the first well layer; and
   the first and second polarization layers comprise more Al than the first and second well layers.

4. The III-N device of claim 1, wherein:
   an individual one of the first and second carrier gases is a two-dimensional electron gas (2DEG);
   a c-plane of the III-N heterostructure is no more than 10° from parallel to plane of an underlying substrate; and
   at least one of the well layers comprises binary GaN.

5. The III-N device of claim 1, wherein the first well layer comprises binary GaN, and the second well layer comprises $Al_xGa_{1-x}N$ with x between 0.02 and 0.07.

6. The III-N device of claim 1, wherein:
   the second polarization layer has a thickness less than 2 nm; and
   the first and second well layers have a thickness more than 2 nm.

7. The III-N device of claim 1, wherein:
   the first terminal comprises a source;
   the second terminal comprises a drain laterally spaced apart from the source; and
   the III-N device further comprises a gate terminal within a space between the source and drain and capacitively coupled to at least one of the first and second well layers to modulate at least one of the first and second charge carrier gases by an electric field.

8. The III-N device of claim 7, wherein the gate terminal comprises a gate electrode separated from the first well layer by at least a gate dielectric, the gate dielectric further comprising at least a metal and oxygen.

9. The III-N device of claim 7, wherein:
   the source is in contact with the first well layer, but not in contact with the second carrier gas; and
   the drain is in contact with the second well layer, but not in contact with the first carrier gas.

10. The III-N device of claim 9, wherein the source is separated from the second well layer by at least the second polarization layer, and the drain extends through the second polarization layer.

11. The III-N device of claim 9, further comprising an isolation feature between the gate terminal and the drain, the isolation feature electrically isolating the drain from the first carrier gas.

12. A radio frequency (RF) mixer, comprising:
   input terminals to receive first and second input signals;
   an output terminal to provide an output signal;
   a Group III-Nitride (III-N) device coupled to the input and output terminals, wherein the III-N device comprises a first two-dimensional electron gas (2DEG) and a second 2DEG with a tunnel barrier therebetween; and
   a bias voltage supply coupled across a first terminal of the III-N device and a second terminal of the III-N device, wherein the III-N device is to conduct a current between the first and second terminals and through the tunnel barrier in response to the first and second input RF signals, and wherein the current is indicative of a difference between the input RF signals.

13. The RF mixer of claim 12, wherein the III-N device comprises a tunnel transistor, and wherein:
   the first terminal comprises a first of a source or drain;
   the second terminal comprises a second of the source or drain;
   the second terminal is coupled to the output terminal; and
   a gate electrode is coupled to the input terminals.

14. The RF mixer of claim 13, wherein the gate electrode comprises a T-structure further comprising a pedestal proximal to the first well layer, and a cap distal from the first well layer, wherein the cap has a lateral dimension larger than that of the pedestal and is operable as an antenna element sensitive to RF within a THz or GHz frequency band.

15. The RF mixer of claim 14, wherein:
the RF mixer further comprises a second III-N device;
the gate electrode is a first gate electrode operable as an antenna element sensitive to RF within a first frequency band; and
the second III-N device further comprises a second gate electrode, wherein a cap of the second gate electrode has a lateral dimension different from that of the first gate electrode, and is operable as an antenna element sensitive to RF within a second frequency band.

16. The RF mixer of claim 12, wherein the III-N device comprises a III-N heterostructure, the III-N heterostructure further comprising:
a first well layer between first and second polarization layers having a larger bandgap than the first well layer, wherein the first polarization layer induces the first 2DEG within the first well layer; and
a second well layer separated from the first well layer by the tunnel barrier, the tunnel barrier comprising at least the second polarization layer, wherein the second polarization layer has a larger bandgap than the second well layer, and wherein the second polarization layer induces the second 2DEG within the second well layer.

17. A radio frequency (RF) integrated circuit (IC), comprising:
a local oscillator;
an amplifier, wherein the amplifier further comprises a first Group III-N (III-N) field effect transistor (FET), the first III-N FET comprising:
a first source, a first drain, and a first gate electrode therebetween;
a first polarization layer comprising a first III-N material; and
a first channel layer comprising a second III-N material, wherein a carrier gas within the first channel layer is to couple the first source to the first drain as a function of a first voltage of the first gate electrode; and
an RF mixer coupled to receive a first signal from the local oscillator, and to receive a second signal from the amplifier, wherein the RF mixer further comprises:
a second III-N FET, the second FET comprising:
a second source, a second drain, and a second gate electrode therebetween;
a second polarization layer comprising a third III-N material; and
a second channel layer comprising a fourth III-N material, wherein:
the carrier gas within the first channel layer is coupled to the second source, and is to couple through the second polarization layer to a second carrier gas within the second channel layer as a function of a second voltage of the second gate electrode; and
wherein the carrier gas within the second channel layer is coupled to the second drain.

18. The RF IC of claim 17, wherein the first III-N FET has a first transconductance, the second III-N FET has a second transconductance, and wherein the second transconductance is more non-linear than the first transconductance.

19. The RF IC of claim 17, wherein the oscillator is operable at a frequency band of at least 75 GHz.

20. The RF IC of claim 19, wherein the amplifier is operable at a frequency band of at least 75 GHz.

* * * * *